United States Patent [19]

Huson

[11] Patent Number: 4,783,628
[45] Date of Patent: Nov. 8, 1988

[54] UNITARY SUPERCONDUCTING ELECTROMAGNET

[75] Inventor: Frederick R. Huson, The Woodlands, Tex.

[73] Assignee: Houston Area Research Center, The Woodlands, Tex.

[21] Appl. No.: 85,649

[22] Filed: Aug. 14, 1987

[51] Int. Cl.⁴ .............................................. G01R 33/20
[52] U.S. Cl. ..................................... 324/320; 335/216
[58] Field of Search ................ 324/300, 307, 318, 319, 324/320, 322; 335/210, 216

[56] References Cited

U.S. PATENT DOCUMENTS

| | | | |
|---|---|---|---|
| 3,331,041 | 7/1967 | Bogner | 335/ |
| 3,378,691 | 4/1968 | Swartz | 307/ |
| 4,490,675 | 12/1984 | Kneuttiel et al. | 324/319 |
| 4,587,490 | 5/1986 | Muller | 324/320 |
| 4,590,428 | 5/1986 | Muller | 324/315 |
| 4,590,452 | 5/1986 | Ries et al. | 335/301 |
| 4,595,899 | 6/1986 | Smith | 324/320 |
| 4,612,505 | 9/1986 | Ziilstra | 324/318 |
| 4,646,045 | 2/1987 | Chari et al. | 335/301 |
| 4,673,881 | 6/1987 | Ries et al. | 324/318 |

OTHER PUBLICATIONS

Report No. 384-21—Superferric Supercollider Reference Design Texas Accelerator Center, Mar. 21, 1984.

Bruker Medical Report dated 1985, Bruker Medizintechnik GmbH.
The Interpolation of Magnetization Tables, Sergio Plissanetzky, Published Nov. 1985.
The New Version of the Finite Element 3D Magnetostatics Program, Sergio Pissanetsky, Published Dec. 1984.
"Magnus", Computer-aided Design of Electromagnets, Sergio Pissanetzky, Published Oct. 1980.

*Primary Examiner*—Michael J. Tokar
*Attorney, Agent, or Firm*—Vinson & Elkins

[57] ABSTRACT

A unitary superconducting electromagnet (10) especially adapted for use in medical or test apparatus with nuclear magnetic resonance (NMR) and spectroscopy at intensities above the magnetic saturation of iron so high as around ten (10) Tesla. The electromagnet (10) includes an inner generally cylindrical body (12) having a central bore (14) and an outer magnetic iron body (16) positioned concentrically about the inner body (12). One embodiment of the electromagnet (10) has adjusting blocks (110) secured to the inner body (12) for movement of the inner body (12) radially and longitudinally of the outer body (16) for precise positioning. Another embodiment shown in FIGS. 16–18 illustrates a small bore electromagnet (10A) having the inner body (12A) fixed relative to outer magnetic iron body (16A) with the outer body (16A) being exposed to the cooling fluid.

25 Claims, 12 Drawing Sheets

UNITARY SUPERCONDUCTING ELECTROMAGNET

BACKGROUND OF THE INVENTION

This invention relates to a unitary superconducting electromagnet having an outer ferromagnetic body about an inner body containing coils and being especially adapted for use in medical or test apparatus with nuclear magnetic resonance (NMR) and spectroscopy.

Heretofore, as shown in U.S. Pat. No. 4,646,045, issued Feb. 24, 1987, ferromagnetic shields have been positioned about an electromagnet used in medical apparatus, such as used in magnetic resonance imaging (MRI), for example. Such a ferromagnetic shield reduces the magnetic stray or fringe field but has an undesirable effect on the magnetic field homogeneity or uniformity. It is noted that magnetic iron saturates at a magnetic field intensity of around one and one-half (1½) Tesla and electromagnets requiring a high precision magnetic field, such as one part per million, have not been utilized generally heretofore at a magnetic field intensity about around two (2) Tesla, particularly where iron shields have been utilized since it is well known that magnetic iron shields at an intensity above around two (2) Tesla have had undesirable effect on the magnetic field homogeneity or uniformity thereby restricting the uniformity of the magnetic field. It is noted that the shielded electromagnet set forth in U.S. Pat. No. 4,646,045 has a uniformity of only around two (2) parts per million at a magnetic intensity of the saturation of iron.

At times, it is desirable to have a portable NMR magnet which can be utilized in portable magnetic resonance imaging apparatus, for example, and a ferromagnetic shield would be required for such a portable magnet for containing the magnetic fringe field. The ferromagnetic shield provides a closed magnetic path and affects the shape and intensity of the magnetic field. Heretofore, a ferromagnetic shield for a superconducting electromagnet has not been provided in which the positioning of the coils and ferromagnetic shield in relation to each and in relation to the magnetic field could be predetermined so that a magnetic field uniformity of at least one (1) part per million is obtained, particularly when utilized in a magnetic field having a intensity greater than the magnetic saturation of the ferromagnetic material such as iron, which saturates at 1.5 Tesla. When superconducting electromagnets are utilized in spectroscopy a very high magnetic field uniformity or homogeneity is required, such as one (1) part in one hundred million and also a very high magnetic field intensity is required, such as eight (8) Tesla, for example. Thus, the requirements for a ferromagnetic shield about a superconducting electromagnet for spectroscopy are even more precise than those utilized for magnetic resonance tomography used in research or in magnetic resonance imaging.

SUMMARY OF THE INVENTION

This invention is particularly directed to a unitary superconducting electromagnet or electromagnetic structure having an outer ferromagnetic body about an inner generally cylindrical body containing the coils and used for nuclear magnetic resonance tomography apparatus or spectroscopy apparatus where a high precision field is required. The outer ferromagnetic body contains any magnetic fringe or stray field and aids in obtaining a uniform distribution of flux for increasing the intensity of the magnetic field at intensities substantially greater than the magnetic saturation of iron. The outer magnetic body absorbs and redirects the magnetic field to maximize the uniformity of the field for increasing the magnetic intensity at least around ten (10) percent at magnetic field intensities as high as around ten (10) Tesla.

In order to obtain such a result, the combination of an inner body having a central bore receiving objects for utilizing the magnetic field from superconducting coils about the bore, and an outer magnetic iron body about the inner body are accurately positioned in relation to each other within a precise tolerance. At least two (2) coils are provided about the central bore in the generally cylindrical inner body and the wire is wouund on the core of each coil under a predetermined tension and within precise tolerances. The use of at least two (2) magnetic coils permits currents of different magnitudes for obtaining a desired shaping of the magnetic field. A highly accurate positioning of the coils and outer ferromagnetic body relative to each other is provided within tolerances of around one mil (0.001 inch) in order to obtain a high precision of uniformity or homogeneity of the magnetic field from at least one (1) part per million to as high as one (1) part per one hundred million which may be required for spectroscopy at magnetic intensities as high as ten (10) Tesla, for example.

In regard to the uniformity or homogeneity of the magnetic field, the unitary electromagnet structure having an outer ferromagnetic body obtains a magnetic field uniformity of at least around one (1) part per million within a sphere of about one-quarter (¼) of the diameter or transverse dimension of the coil aperture or opening, which is suitable for use with NMR magnets. When such unitary electromagnets are utilized in spectroscopy, a uniformity of the magnetic field of one part in one hundred million is required within a sphere of a few centimeters, such as one (1) to three (3) centimeters of the diameter of the coil opening.

The outer ferromagnetic body of the unitary electromagnet adjacent the superconducting coils increases the intensity of the magnetic field as much as around twenty (20) percent or more and this is accomplished only by an accurate calculation of the parameters of the magnetic field and the relative locations of the inner and outer bodies in relation to the coils and the magnetic field. The outer ferromagnetic body distributes the magnetic field flux in a smooth uniform manner at magnetic field intensities substantially above the magnetic saturation of magnetic iron as high as around ten (10) Tesla. Thus, the saturation of the magnetic iron in the outer body enhances the uniform distribution of flux.

In order to obtain such a high quality magnetic field homogeneity or uniformity of at least around one part per million, a very precise method or series of steps is involved in the design of the electromagnet. First, the volume, shape, and intensity of the magnetic field for the superconducting electromagnet are established and an initial design is created for maximizing field intensity with a minimum coil size and including some means for lateral access to the magnetic field in order to adjust the relative positioning of the coils and outer magnetic iron body in relation to each other and in relation to the magnetic field within a tolerance of around one mil (0.001 inch).

An initial design is established based on (1) computer programs utilizing (a) the parameters of the volume, shape, and intensity of the desired magnetic field; and (b) accurate information concerning the mechanical, thermal, electrical, and magnetic properties of the materials proposed for the electromagnet, including particularly the thermal and magnetic properties of the iron for predicting precisely the permeability of the iron at all values of the magnetic field; (2) appropriate engineering techniques to obtain the precise positioning of the components of the magnet includig particularly the positioning of the coils and the outer magnetic iron body in relation to each other and to the magnetic field; and (3) utilization of appropriate electromagnetic equations for achieving a practical, economical, enginerring design. Then, the prototype superconducting electromagnet is manufactured based on the results and calculations obtained.

Additionally, in order to obtain such a high precision magnetic field, the coils are wound within a tolerance of around one (1) mil under a predetermined tensioning of the wire forming the coils. The electromagnet operates in a persistent current mode in which a superconducting switch switches from a charging power suppply to the persistent mode. It is also necessary to provide adequate cooling for the superconducting coils and a cooling fluid such as helium or nitrogen may be employed for such cooling so that the superconducting members are cooled below their critical temperature to cause such members to become superconducting.

It is an object of the present invention to provide a unitary superconducting electromagnet or electromagnetic structure having an outer ferromagnetic body about an inner body containing coils in which the magnetic field has a uniformity of at least around one (1) part per million and as high as one (1) part per hundred million, particularly for use in medical or test apparatus with magnetic resonance imaging and spectroscopy.

It is a further object of this invention to provide such a unitary superconducting electromagnet having an outer ferromagnetic body which is particularly adapted for utilization with magnetic fields having an intensity above the magnetic saturation of iron and as high as around ten (10) Tesla.

An additional object of the invention is to provide such a superconducting electromagnet in which the outer magnetic iron body includes an end assembly adjacent each end of an inner generally cylindrical body for the coils and increases the magnetic intensity of the magnetic field at least around ten (10) percent.

Another object of this invention is to provide such an electromagnet in which the outer magnetic iron body is fixed relative to the inner body after initial construction and is exposed to the cooling medium for the coils.

Other objects, features and advantages of this invention will become more apparent after referring to the following specification and drawings.

DETAILED DESCRIPTION OF THE INVENTION

Figure 1:
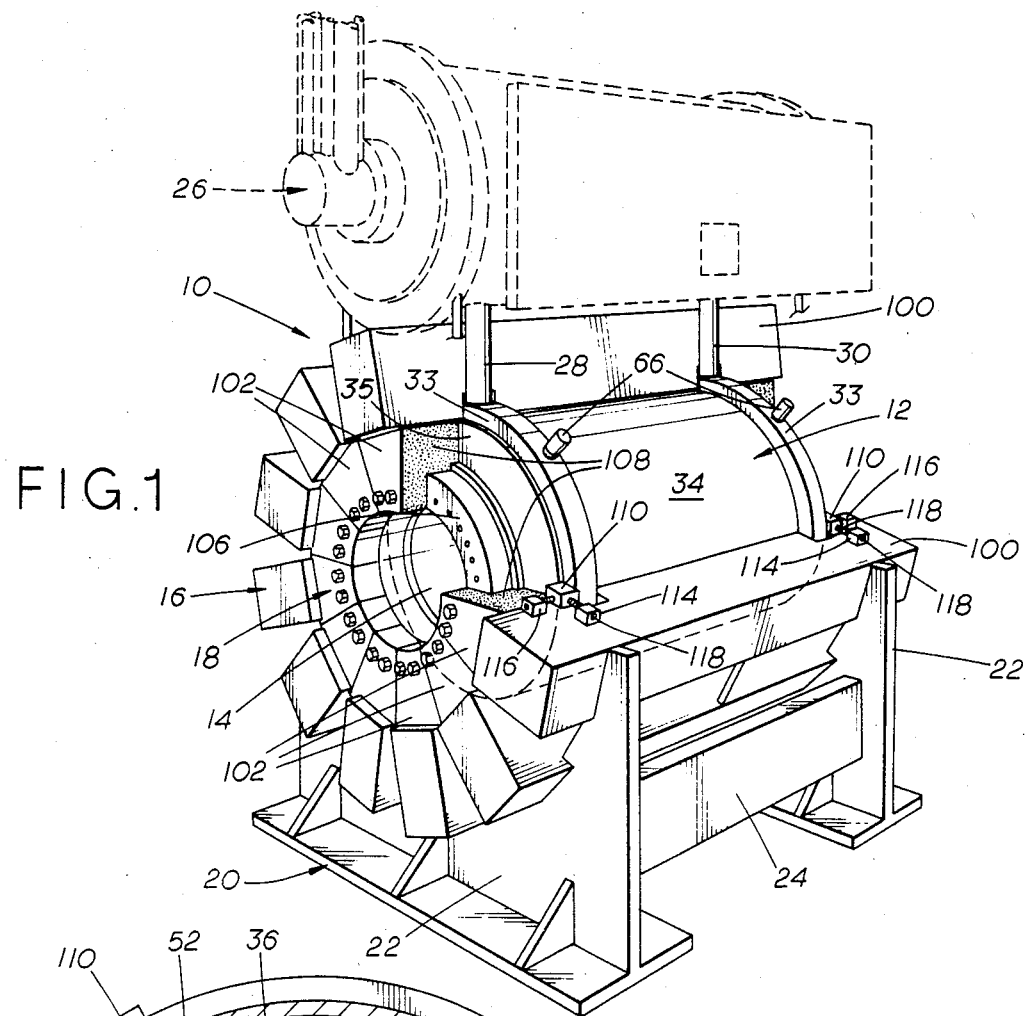
FIG. 1 is a perspective with certain parts broken away of an example of a unitary superconducting electromagnet in accordance with the present invention having an inner body with a central bore therethrough and an outer ferromagnetic body about the inner body, and illustrating means to position accurately the outer body relative to the inner body and associated coils.

A preferred embodiment of a unitary superconducting electromagnet structure in accordance with the present invention is shown in FIGS. 1-15 of the drawings and is particularly adapted for use with nuclear magnetic resonance (NMR) equipment for medical apparatus. Unitary electromagnet structure 10 includes an inner cylindrical body or housing generally indicated at 12 and being of a toroidal shape having a central bore 14 therethrough and mounted within an outer magnetic iron body indicated generally at 16. Outer magnetic iron body 16 includes opposed end plate assemblies 18 between which inner body 12 is mounted. Bore 14 is of a size sufficient to receive the body of a patient.

A cradle type base support generally indicated at 20 includes opposed end suppport cradle members 22 formed of a non-magnetic material with longitudinally extending beams 24 secured between end support members 22. Mounted on the upper surface of magnetic iron body 16 is cryogenic cooling means shown in broken lines generally at 26 including a cooling medium, such as helium or nitrogen, for cooling the superconducting electromagnet 10 to the superconducting temperature of the materials used in the electromagnet. An inlet is shown at 28 for providing the cooling fluid about a fluid passageway for cooling the electromagnet and an outlet is shown at 30 for receiving the cooling fluid after cooling of the superconducting materials.

Figure 3:
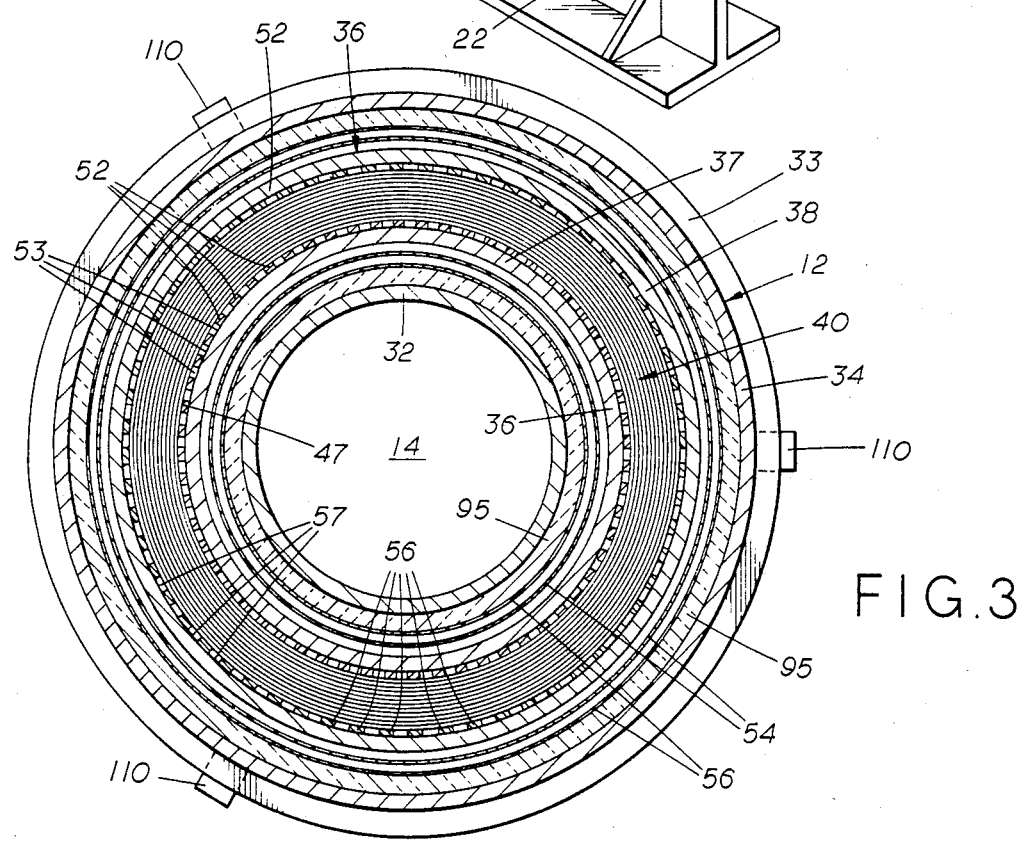
FIG. 3 is a transverse cross section of the generally cylindrical inner body for the coils of the electromagnet and illustrating particularly the arrangement of heat shields and cooling means about the superconducting coils.
Figure 2:
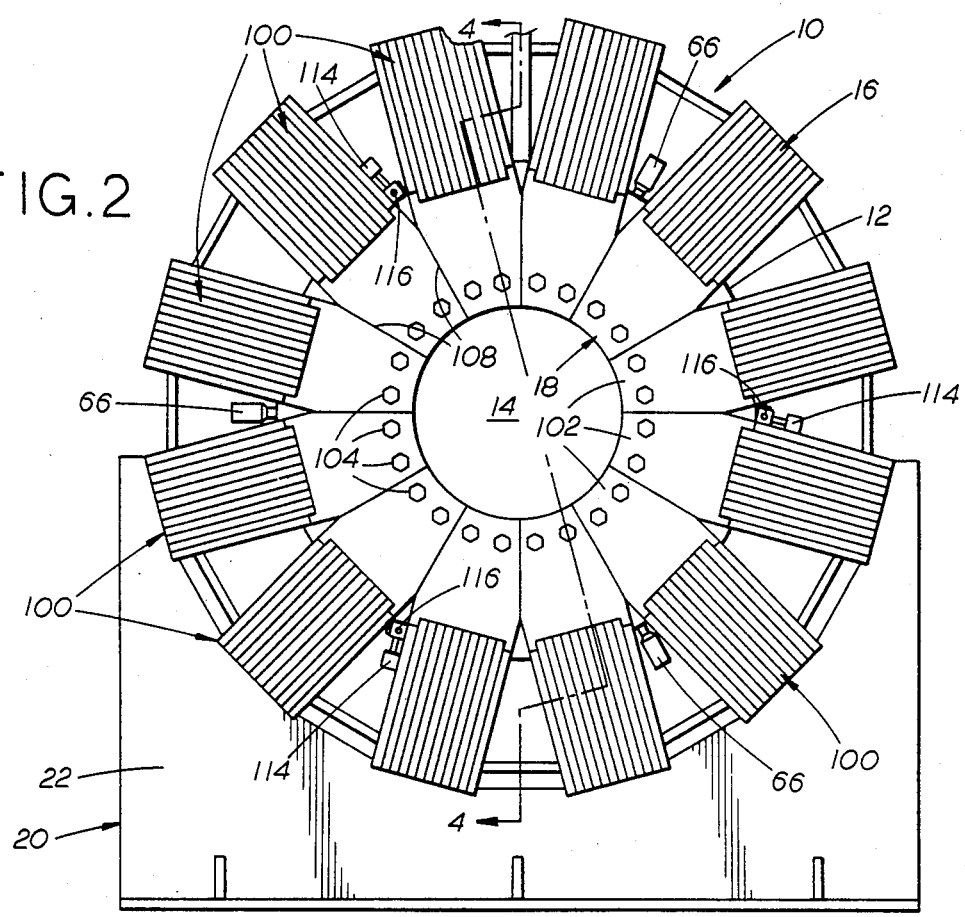
FIG. 2 is an end elevation of an electromagnet shown in FIG. 1 showing the outer ferromagnetic body formed in a plurality of segments and supported on a cradle-type base support.
Figure 4:
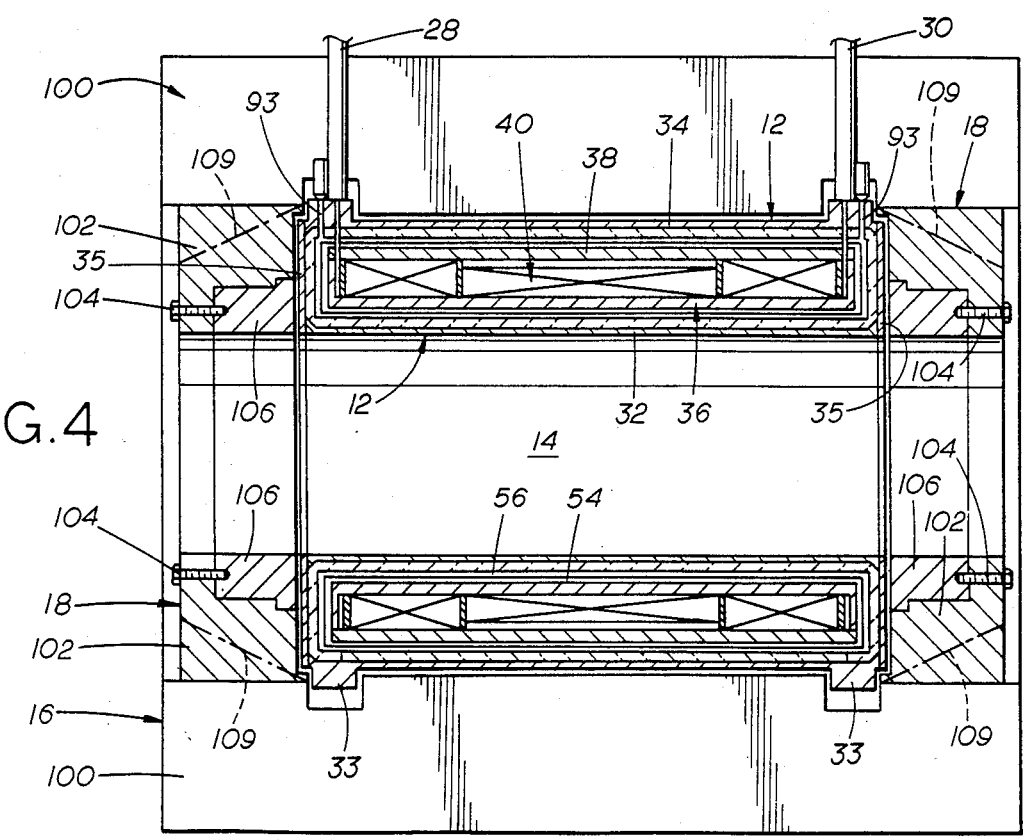
FIG. 4 is a longitudinal sectional view taken generally along line 4—4 of FIG. 2 and showing the inner cylindrical body for the coils mounted within the outer ferromagnetic body about the inner body.
Figure 5:
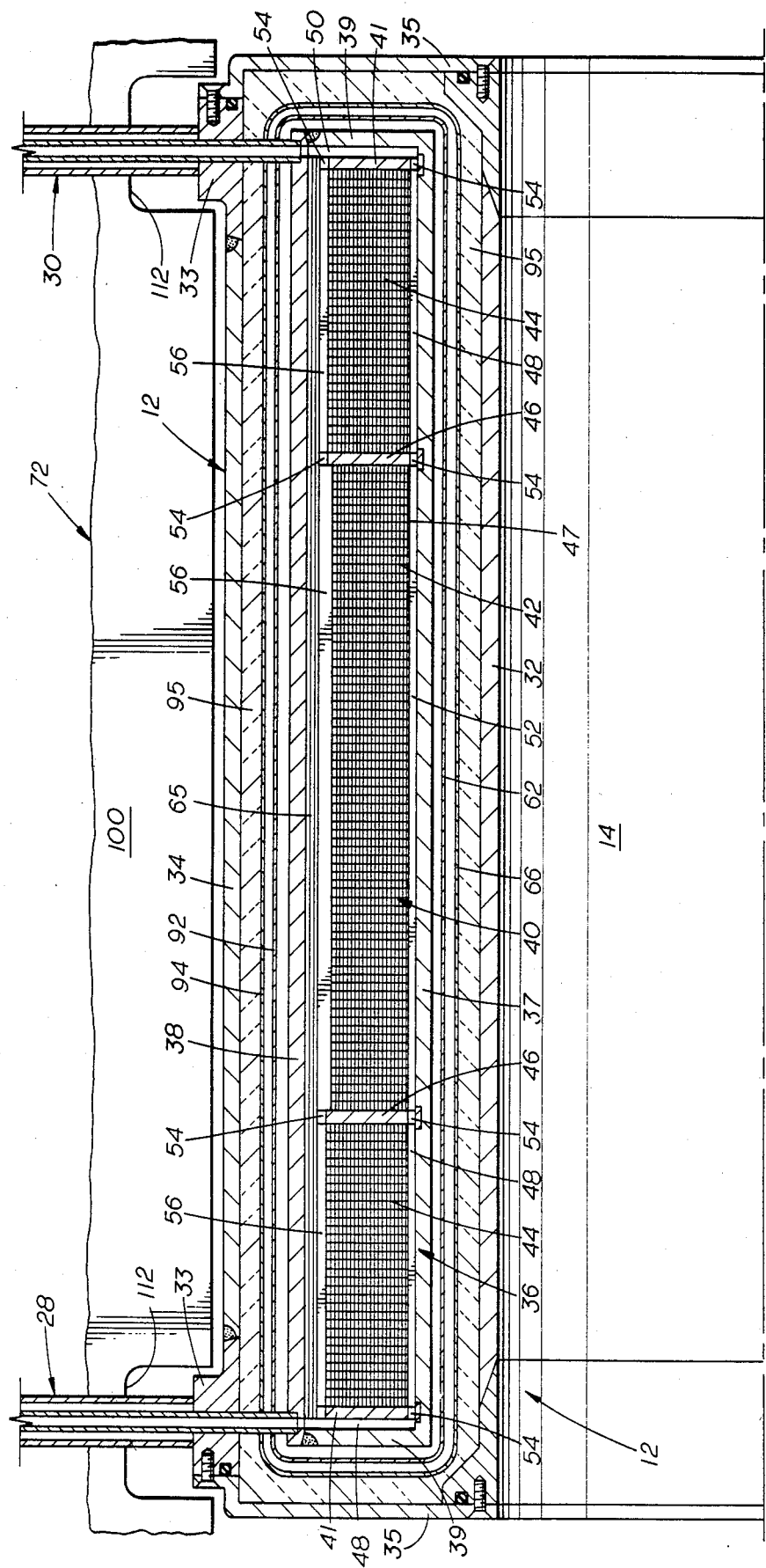
FIG. 5 is an enlarged longitudinal section of a fragment of FIG. 4 showing the specific arrangement of the coil pack containing the coils within the enclosed inner cylindrical body.

As shown in FIG. 3-5, inner cylindrical body 12 has an inner shell 32 which defines bore 14 and an outer concentric shell 34. Inner shell 32 is preferably formed of a fiberglass epoxy non-conducting material. An end ring 33 is secured to outer shell 34 at each end thereof. End plates 35 connect concentric shells 32 and 34 at their ends to form an enclosed annular body defining a vacuum jacket. As well known, means (not shown) are provided for exerting a vacuum in the space between shells 32 and 34. Fitting within the enclosed annular space defined by inner body 12 is an enclosed housing generally indicated 36 for the superconducting coils. Enclosed housing 36 is formed by intermediate spaced concentric shells generally indicated 37 and 38 having their ends closed by annular end plates 39 thereby providing an enclosed annular space receiving the superconducting coil assembly or coil pack indicated generally at 40. Coil pack 40 defined between annular end plates 41 includes a main center coil 42 and an end coil 44 adjacent each end of center coil 42 separated by annular intermediate spacer plates 46 formed of a non-magnetic material. End plates 41 of coil pack 40 are spaced from adjacent end plates 39 of inner body to form an annular cooling fluid inlet chamber 48 adjacent one end of coil pack 40 and an annular cooling fluid outlet chamber 50 adjacent the other opposite end of coil pack 40.

Forming a core or bobbin on which the wire of coils 42, 44 is wound is a plurality of circumferentially spaced strips or slats 52 which are secured to end plates 41 and intermediate plates 46. Inner strips 52 in supporting contact with shell 37 are formed of a non-magnetic material having a width of around one-half ($\frac{1}{2}$) inch and are spaced from each other around one-eighth ($\frac{1}{8}$) inch to provide fluid flow passages 53 therebetween. End plates 41 and intermediate plates 46 have a plurality of openings 54 therethrough for flow passages. Likewise, a plurality of circumferentially spaced outer strips 56 are arranged in a manner similar to inner strips 52 and form flow passages 57 therebetween.

Figure 6:
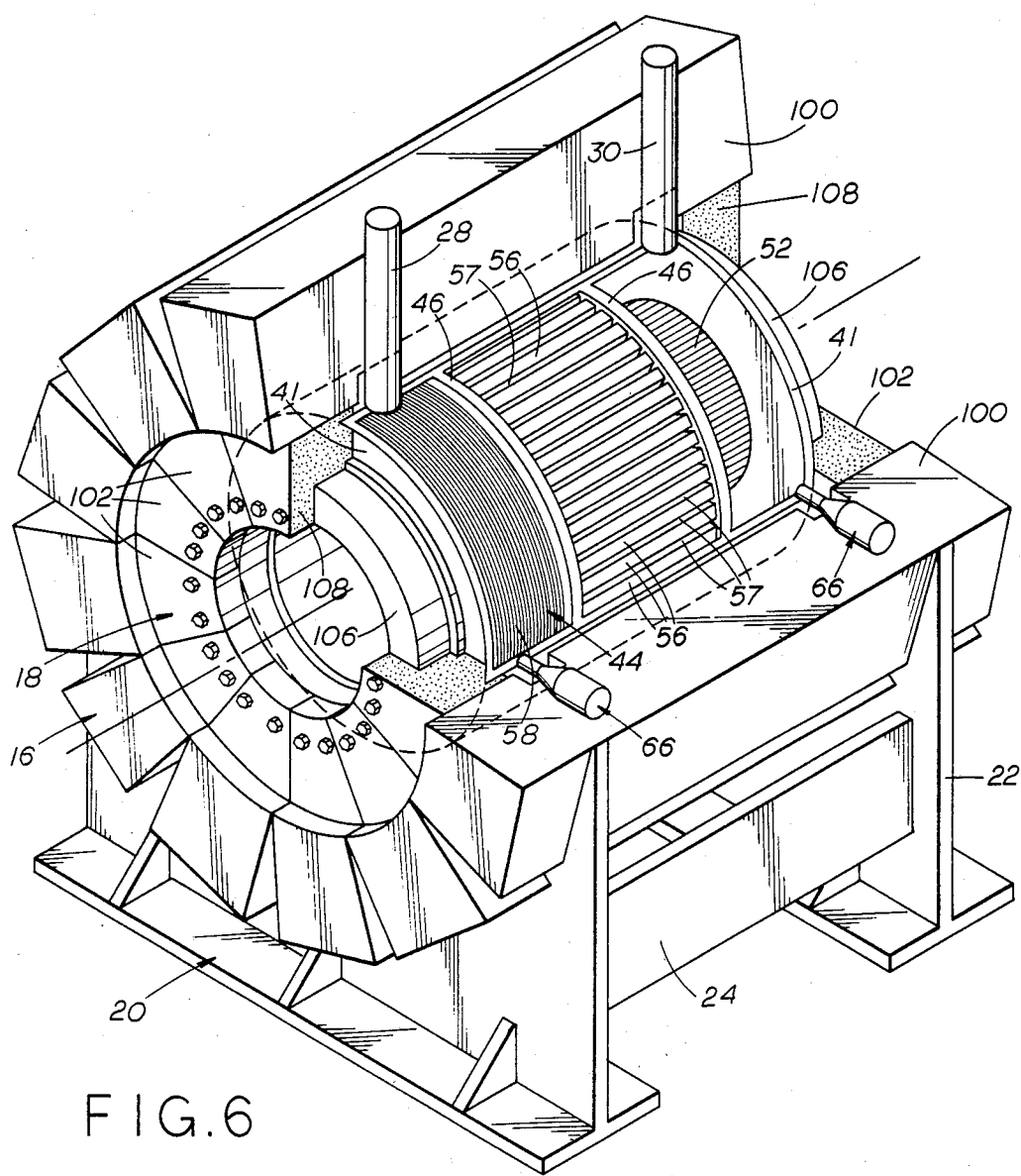
FIG. 6 is a perspective view similar to FIG. 1 but showing certain parts of the inner cylindrical body broken away for illustrating the coils and associated cores on which the coils are wound for providing flow passages along the coils for the cooling fluid.
Figure 6A:
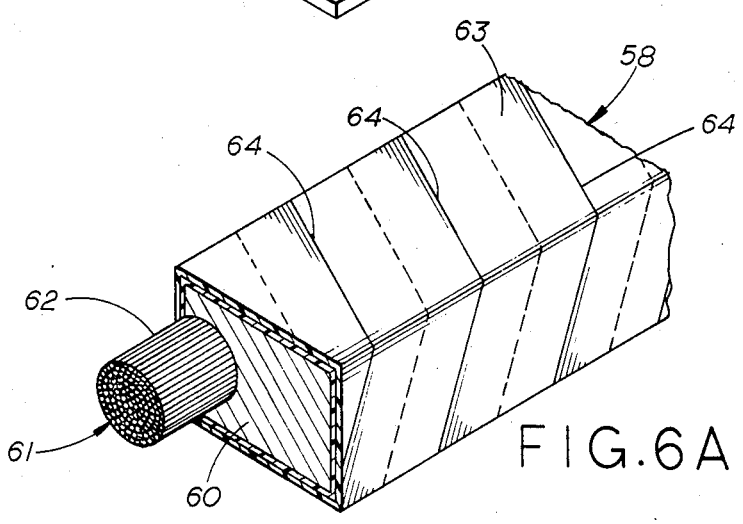
FIG. 6A is a perspective with certain parts broken away of the wire forming the coils.

The wire generally indicated 58 from which coils 42 and 44 is formed is spirally wound in opposite directions on the core formed by strips 52 within an accuracy of around one mil (0.001 inch) and while tensioned under a predetermined tension dependent on the properties and size of the wire material. As shown in FIG. 6A, wire 58 has a rectangular cross section having transverse dimensions of fifty (50) mils by one hundred (100) mils and includes a copper body 60 about a core indicated generally at 61. Core 61 is of a diameter of around 0.025 inch and comprises a plurality of niobium titanian (NbTi) strands, each having a diameter of 0.025 milimeters. Copper body 60 is spirally wrapped in opposed directions with half laps of polyimide plastic tape 63 around 0.25 inch in width and 0.002 inch in thickness to provide an outer insulating covering for wire 58 formed of two wraps of tape 63. The outer edges or outer seams 64 of tape 63 are not bonded to the subjacent layer of tape 63 and form a fluid flow passage through which helium cooling fluid seeps for cooling of wire 58. Wire 58 is tensioned under a predetermined tension of around one hundred (100) pounds while being wound onto the associated supporting core 47 and the tension is gradually and progressively decreased during winding in accordance with precise calculations based on the type and size of materials utilized, the thermal and mechanical properties of the materials, and the position of the wire on the core. The use of a plurality of magnetic coils permits currents of different magnitudes to be utilized thereby to aid in obtaining a desired shaping and intensity of the magnetic field. Upon winding of wire 58 on inner strips 52 and outer strips 56, an outer layer of stainless steel banding 65 is spirally wound about outer strips 56.

Figure 10:
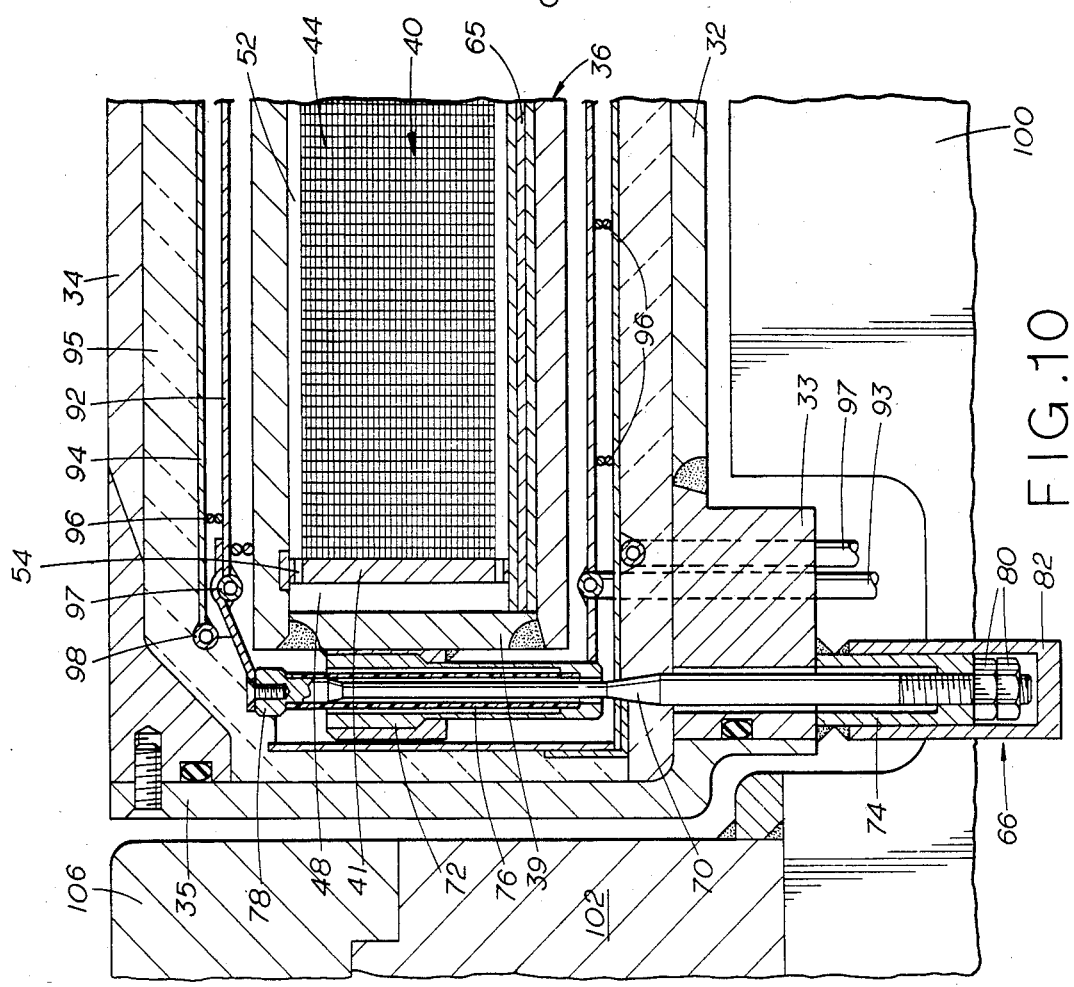
FIG. 10 is a section of the support for the cryogenic structure taken along line 10—10 of FIG. 9.

For supporting coil pack 40 in the annular space defined by inner body 12 between concentric shells 32 and 34 are radially extending end tensioning devices or supports generally indicated at 66 positioned between end rings 33 of body 12 and end plates 41 of housing 36 containing coil pack 40; and longitudinally extending tension devices or supports generally indicated at 68 extending between one of the end rings 33 on body 12 and the opposed end plate 41 of housing 36. End tensioning supports 66 as shown particularly in FIG. 10 are arranged adjacent each end of electromagnet 10 at one hundred twenty (120) degree intervals about the circumference thereof. Tension supports 66 each comprises a tension rod 70 having an end mounted in a bearing support 72 on end plate 39 and an opposite end mounted on a bearing support 74 on ring 33. An insulating sleeve 76 on bearing support 72 fits about rod 70 and an end retainer 78 is mounted on an end of rod 70 adjacent sleeve 76. Bearing support 74 is secured to end ring 33 and receives the threaded end of rod 70. Adjusting nuts 80 are utilized for adjusting and controlling the amount of tension on rod 70 upon removal of an external sleeve 82 threaded onto bearing support 74.

Figure 7:
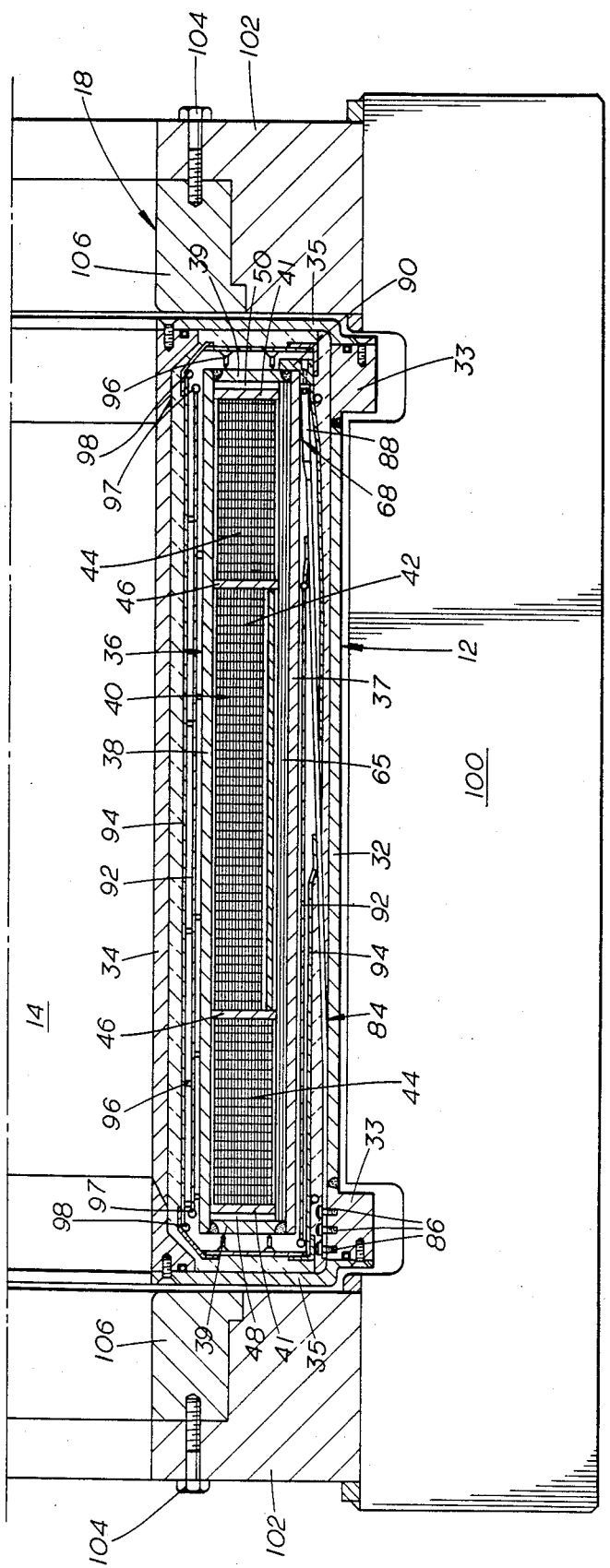
FIG. 7 is a longitudinal section similar to FIG. 5 but showing the arrangement of the heat shields encircling the coil pack and associated coils.
Figure 8:
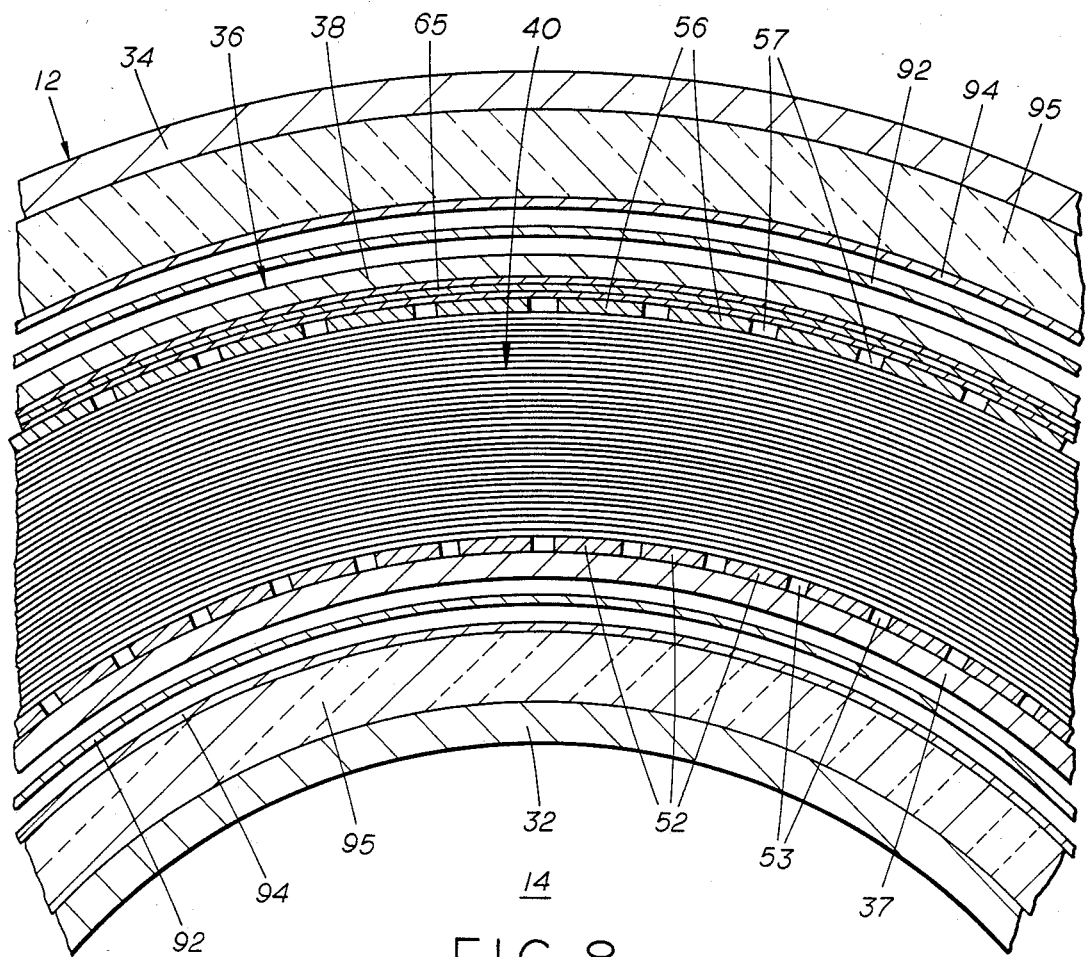
FIG. 8 is an enlarged fragment of FIG. 3 showing specific layers forming the inner cylindrical body.
Figure 7A:
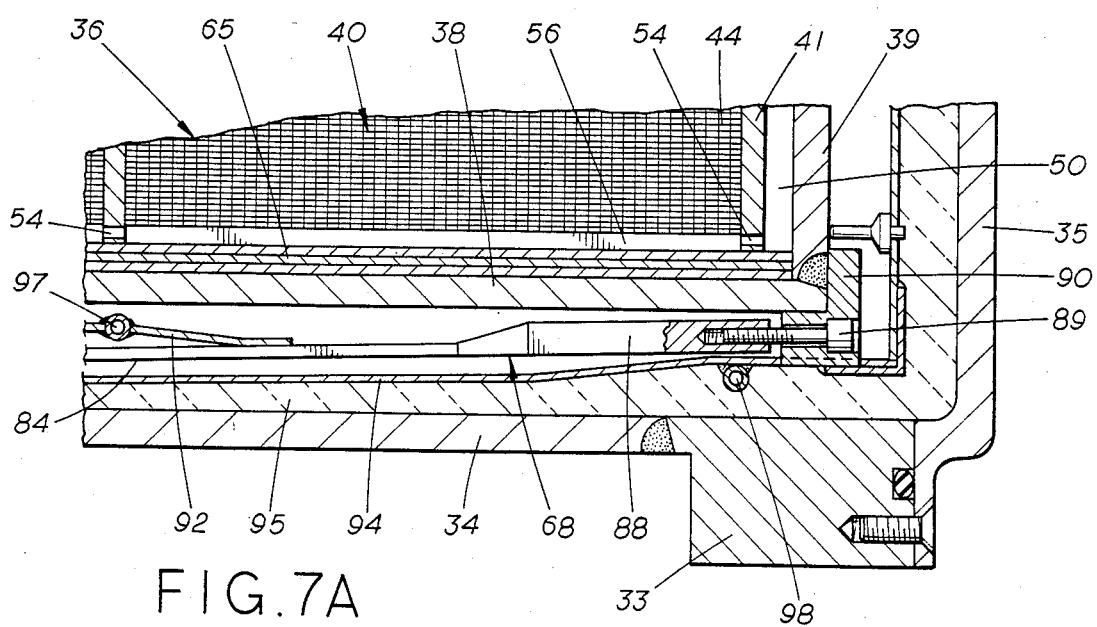
FIG. 7A is an enlarged fragment of FIG. 7 showing the connection of the tension straps to the housing for the coils.
Figure 9:
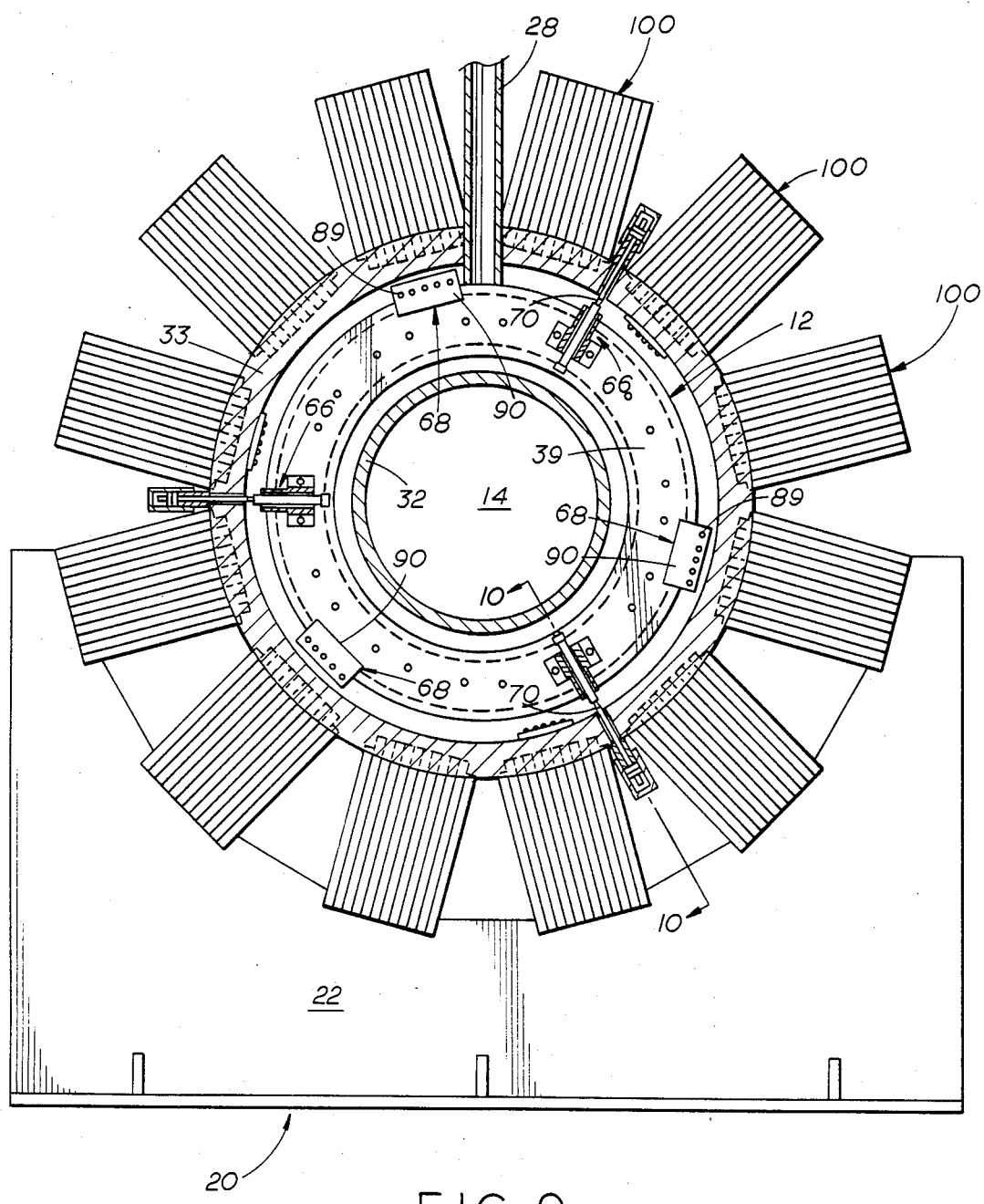
FIG. 9 is a cross sectional view, with certain portions shown in elevation, of the support means for the superjacent cryogenic structure mounted on the electromagnet.

Three longitudinal tension devices 68 as shown particularly in FIGS. 7, 7A and 9 are mounted on each end ring 33 at one hundred twenty (120) degree intervals about the circumference thereof with the tension devices 68 on one end ring 33 being staggered circumferentially with respect to the tension devices 68 on the opposed end ring 33. Each tension device or support 68 includes a strap 84 having one end fixed by studs 86 to adjacent end ring 33 and having an opposite end portion 88 of an increased thickness for securement by threaded bolts 89 to an angle-shaped end support member 90 lapping adjacent end plate 39 of housing 36. Angle-shaped member 90 is spaced slightly from end portion 88 and the tension in associated strap 84 is adjusted by adjustment of bolts 89 which extend through member 90 into threaded engagement with end portion 88. Straps 84 are preferably formed of titanium. Thus, by accurate adjustment of radial tension devices 66 and longitudinal tension devices 68, coil pack 40 may be precisely positioned within the annular space defined by inner body 12.

As shown particularly in FIG. 5, helium from inlet 28 flows to fluid inlet chamber 48 adjacent coil pack 40 and then through openings 54 and the fluid passages 53, 57 formed between spaced strips 52 and 56 along coil pack 40 to fluid outlet chamber 50 for return to the cryogenic cooling means 26 through outlet 30. An inner heat shield shown generally at 92 of a metallic material for a temperature of twenty (20) degrees Kelvin is formed about housing 36 enclosing coil pack 40. An outer heat shield 94 extends about inner heat shield 92 in spaced relation thereto and is formed of a metallic material for a temperature of eighty (80) degrees Kelvin. A suitable metallic material for heat shields 92 and 94 has been found to be a plurality of closely spaced longitudinally extending copper strips having a silvered tape coating thereon for reducing emissivity as well known in the art. A super insulating material shown at 95 is provided in the space between outer heat shield 94 and the vacuum jacket formed by inner and outer shells 32, 34. An insulating material 95 which has been found to be satisfactory is mylar having a silver coating thereon. As shown in FIG. 7, heat shields 92 and 94 are spaced from each other and from coil pack 40 by suitable spacers 96. Annular copper tubing 97 extends about each end of shield 92 and copper tubing 98 extends about each end of shield 94 in FIGS. 7 and 10 to provide a fluid flow passage for a cooling fluid such as helium. Fluid passages 93 for tubing 97 and fluid passages 99 for tubing 98 provide fluid communication with the source of cooling fluid.

Outer magnetic iron body 16 includes a plurality of longitudinally extending sections indicated at 100. Each section 100 has a plurality of plates secured to each other and forming laminations extending between end plate assemblies 18. Each section 100 has secured adjacent each end thereof a radially extending segment 102 secured by bolts 104 to an end ring 106 thereby to form the end plate assembly indicated at 18 positioned adjacent each end of inner cylindrical body 12. The contacting sides 108 of adjacent segments 102 have a layer of insulating material thereon, such as insulating paint. By having segments 102 insulated from each other, the paths of the eddy current are broken up by increasing the resistance to such paths. Also, if desired, segments 102 may be formed of a plurality of connected plates which break up the paths of the eddy currents.

It is noted that end plate assemblies 18 particularly as shown in FIG. 4 are positioned closely adjacent the end of inner body 12 and coil pack 40, and have inner and outer diameters generally corresponding to those of inner body 12. Outer body 16 provides a closed magnetic path extending from coil pack 40 along end assemblies 18 and connecting sections 100 of outer iron body 16. The portions of end assemblies 18 radially inward of line 109 shown in FIG. 4 when positioned closely adjacent coil pack 40 have a magnetic intensity greater than the saturation of iron or above around 1.5 or 1.7 Tesla while the remainder of outer body 16 including longitudinally extending sections 100 has a magnetic intensity at the saturation level. For a four (4) Tesla magnet, for example, the magnetic intensity of end assemblies 18 radially inwardly of line 69 would vary from around 1.5 Tesla to around four (4) Tesla. However, by precise positioning of outer body 16 relative to inner body 12, end assemblies 18 which form pole faces aid in increasing the intensity of the magnetic field. For this purpose, accurate information concerning the thermal and magnetic properties of the iron in end assemblies 18 is required for predicting precisely the permeability of the iron at all values of the magnetic field. Up to around 2.5 Tesla, the permeability is measured in accordance with well known techniques. However, above 2.5 Tesla the measured values of the permeability of the iron in outer body 16 and end assemblies 18 are used to obtain the magnetization saturation and these calculations are then employed to obtain the permeability from an interpolation of the Frolich-Kennelly formula as set forth in the publication entitled "The Interpolation of Magnetization Tables", dated 1986, authored by Sergio Pissanetzky and obtainable from the Texas Accelerator Center, 2319 Timberloch Place, The Woodlands, Tex. 77389 U.S.A. Thus, a magnetization table for a specific iron material, such as U.S. 1008 steel, for example, may be established.

In order to obtain the precise positioning of coils 42 and 44 with respect to outer body 16 about the inner cylindrical body 12 containing coils 42, 44 in relation to each other and in relation to the magnetic field, a precise adjustment of inner body 12 both radially and longitudinally relative to outer magnetic iron body 16 must be provided. For this purpose and referring particularly to FIG. 1, adjusting blocks 110 are secured to the outer surface of outer shell 34 of inner body 12 at spaced intervals of one hundred twenty (120) degrees about the outer circumference of outer shell 34 and adjacent each end thereof to provide three (3) longitudinally aligned pairs of adjusting blocks 110 which fit within suitable slots 112 provided in adjacent sections 100 of outer magnetic iron body 16. Mounted on an outer lamination of the adjacent longitudinal extending sectios 100 for each of blocks 110 is a radial block 114 and an axial block 116. Blocks 114 and 116 contain adjustable set screws 118 accessible to workmen through the space between sections 100. Set screws 118 have their inner ends in contact with blocks 110 for moving inner cylindrical body 12 within radial and axial distances of one mil (0.001 inch) relative to outer magnetic iron body 16 through suitable adjustment of screws 118 on blocks 114 and 116. By accurate positioning of inner cylindrical body 12 relative to outer magnetic iron body 16, the precision of the magnetic field to at least one (1) part per million is obtained and this is accomplished only by accurate calculation of the parameters of the magnetic field along with accurate positioning.

Figure 11:
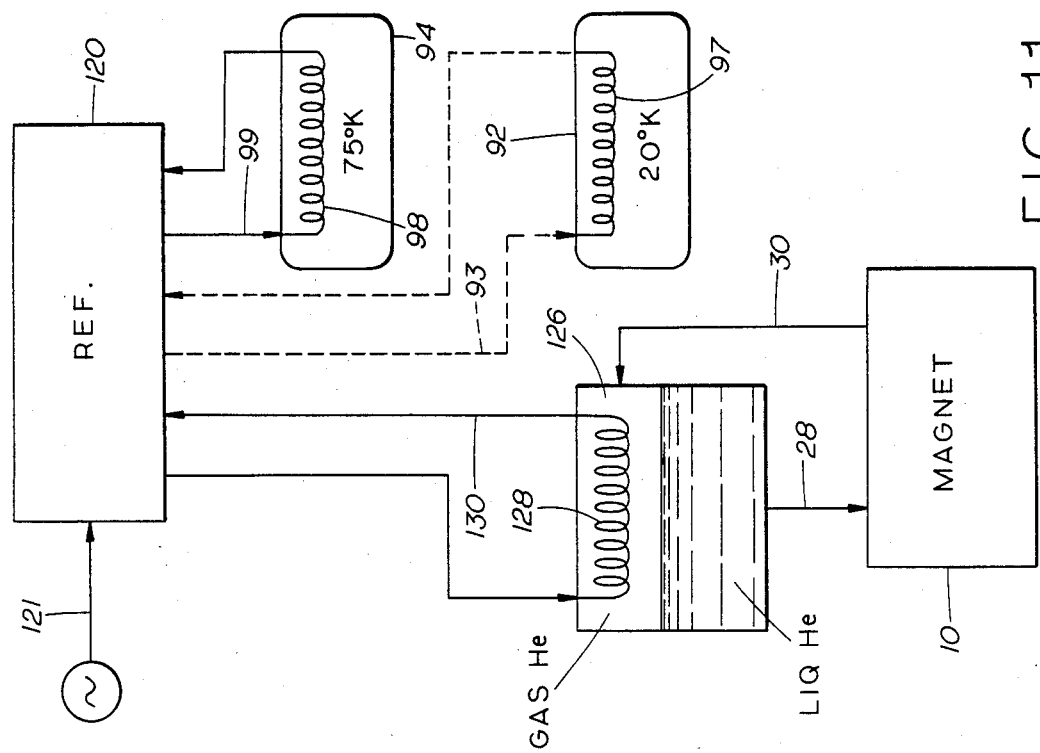
FIG. 11 is a schematic view of the cryogenic cooling means illustrating the flow paths for the cryogenic fluid, such helium.

Referring to FIG. 11, a schematic of the cooling means indicated generally at 26 is illustrated and includes a refrigerator 120 having a suitable compressor, expansion valve, and heat exchanger for helium refrigerant. Refrigerator 120 may be plugged by line 121 into a suitable receptacle for the supply of electrical energy. Liquid helium is supplied to inner heat shield 92 from refrigerator 120 through line 93 and supplied to outer heat shield 94 through line 98. Liquid helium is supplied to magnet 10 through inlet 28 from fluid tank 126 and a mixture of liquid and gaseous helium is returned to tank 126 from outlet 30. Gaseous helium is returned to refrigerator 120 through line 130. Heat exchanger 128 converts the gaseous helium returned from magnet 10 to liquid helium for supplying liquid helium to magnet 10 through line 28. A cryogenic refrigeration system which has been found to be satisfactory is sold by CVI Incorporated, Columbus, Ohio and designated as a "CGR511-4.5 Ultralow Temperature System—4.5 Kelvin Cryogenic Refrigeration System".

In order to obtain the precise positioning of coils 42 and 44 with respect to outer body 16 about the inner outer magnetic iron body 16, the precision of the magnetic field to at least one (1) part per million is obtained and this is accomplished only by accurate calculation of the parameters of the magnetic field along with accurate positioning.

It is noted that a high quality magnetic field homogeneity or uniformity of at least one (1) part per million is required for many applications of the unitary superconducting electromagnet and some applications, such as spectroscopy require a uniformity in the magnetic field of one (1) part per one hundred million. In order to obtain such a high quality magnetic fiedl, a very precise method or series of steps is involved in the design of the electromagnet. First, the volume, shape and intensity of the magnetic field for the superconducting elecromagnet are established and an initial design is created for maximizing field intensity with a minimum coil size and including some means such as a central bore for access to the magnetic field in order to place objects therein for testing or treatment. The initial design includes positioning the superconducting coils and outer ferromagnetic body in relation to each other and to the magnetic field so that the desired effect on the intensity and shape of the magnetic field may be obtained from radial and axial adjustment of the coils and outer magnetic iron body in relation to each other within a tolerance of one (1) mil.

Further, the initial design is established based on one (1) computer programs using (a) parameters of the volume, shape, and intensity of the desired magnetic field; and (b) accurate information concerning the mechanical, thermal, electrical, and magnetic properties of the materials proposed for the unitary electromagnet, including particularly the thermal and magnetic properties of the iron for predicting precisely the permeability of the iron at all values of the magnetic field; (2) appropriate engineering techniques to obtain the precise positioning of the components of the magnet including particularly the positioning of the inner body coils and the magnetic iron body in relation to each other and to the magnetic field; and (3) utilization of appropriate electromagnetic equations for achieving a practical, economical, engineering design. The computer programs may incorporate, if desired, the appropriate engineering techniques and electromagnet equations set forth under items (2) and (3) above or these items may be employed separately from the computer programming in obtaining the initial design. A computer program which has been utilized satisfactorily in the design of the present invention is referred to as the "Magnus" program and is set forth in the following publications authored by Sergio Pissanetzky and obtainable from Texas Accelerator Center, 2319 Timberloch Place, The Woodlands, Tex. 77380 U.S.A.:

(1) Manuscript identified as BNL (Brookhaven National Laboratory) 28416 AMD 867 entitled "Magnus—Comter-Aided Design of Electromagnets".
(2) Publication dated 1986 entitled "The New Version of the Finite Element 3D Magnetostatics, Program Magnus"

Another computer program which has been found to be satisfactory for utilization with the present invention is the "Poisson/Superfish" program as set forth in Report No. LA-UR87-115 entitled "User's Guide for the Poisson/Superfish Group of Codes, issued January 1987, authored by M. T. Menzel, H. K. Stokes and obtainable from Los Alamos National Laboratory, Los Alamos, N.M. 87545 U.S.A. Then, after the establishment of the initial design based on the results and calculations obtained, the prototype superconducting electromagnet is manufactured.

It is pointed out that with a magnetic field intensity above the magnetic saturation of the outer ferromagnetic body, such as four (4) Tesla, for example, the magnetic iron of the outer body increases the intensity of the magnetic field at least around ten (10) percent and as much as around twenty (20) percent or more due to the precise location of the magnetic iron with respect to the magnetic field and the coils. The outer magnetic iron body absorbs and directs the magnetic fringe field to provide such an increase in the magnetic intensity. This is accomplished by a distribution of the flux in a uniform manner and at magnetic field intensities substantially above the magnetic saturation of the magnetic iron as high as around ten (10) Tesla. The accurate and precise positioning of the outer magnetic iron body relative to the coils within a tolerance of one (1) mil also results in the high degree of uniformity of the field of at least around one (1) part per million.

Figure 12:
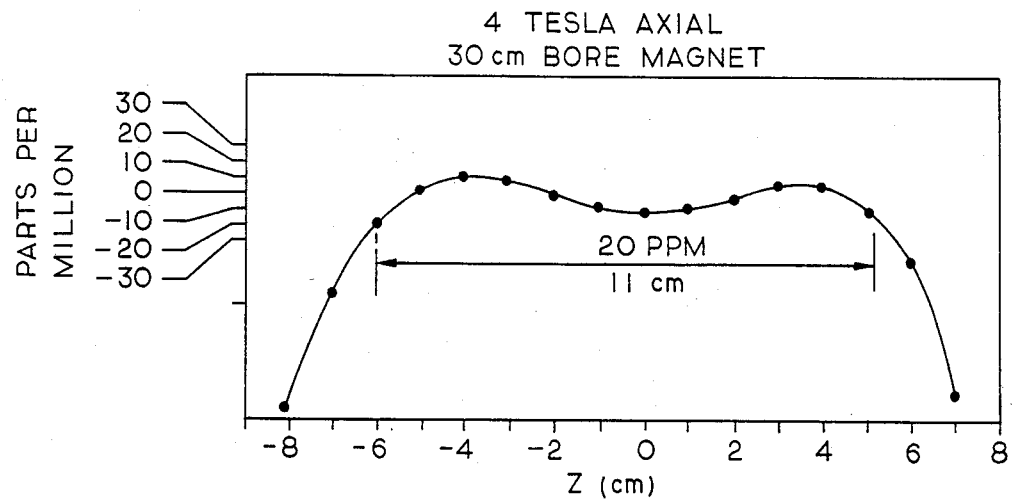
FIG. 12 is a graph showing a field uniformity for a four (4) Tesla magnetic field with an axial dimension for the electromagnet and utilizing an outer magnetic iron body.
Figure 13:
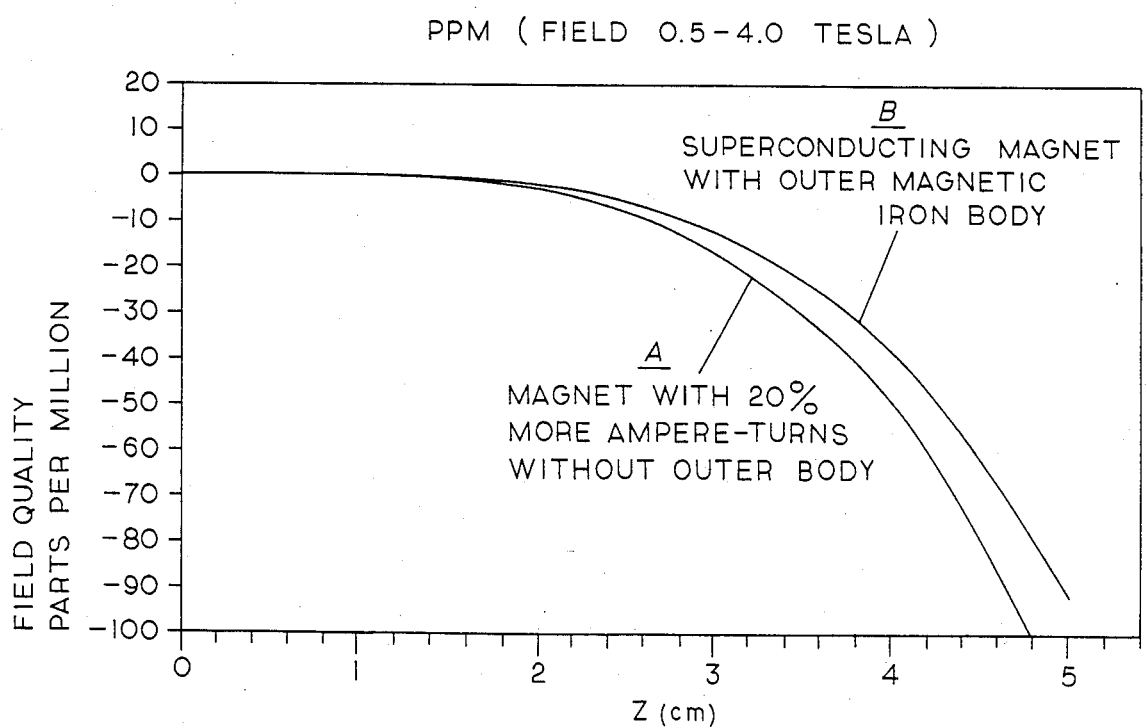
FIG. 13 is a graph comparing the magnetic field intensity of the unitary superconducting electromagnet of this invention in which an outer magnetic iron body is positioned about the inner body containing the coils, with the electromagnet without an outer body and having a twenty (20) percent increase in the ampere turns of the coils.

FIGS. 12 and 13 are directed to graphs which illustrate the results obtained for a superconducting unitary electromagnet constructed in accordance with the foregoing method and as shown and described in the drawings. Referring to FIG. 12, a graph is shown illustrating the homogeneity for a magnetic field intensity at four (4) Tesla in an axial direction along the longitudinal centerline of bore 14. It is noted a uniformity of twenty (20) ppm is obtained within eleven (11) cm without the use of any trim coils or trim fields.

Referring now to FIG. 13, this graph shows the increase in magnetic field intensity of over twenty (20) percent with the utilization of a magnetic iron body about the superconducting coils with the increase in intensity begin generally uniform for field intensities from one-half ($\frac{1}{2}$) Tesla to four (4) Tesla. Curve A illustrates an electromagnet in which magnetic coils are utilized without a magnetic iron body with the coils being wound with twenty (20) percent additional ampere turns. Curve B indicates the field quality obtained with a unitary superconducting electromagnetic structure in accordance with the present invention in which an magnetic iron body about the coils is utilized. Thus, it is believed apparent that the utilization of a unitary superconducting electromagnet constructed in accordance with the method set forth, and with the coils being positioned precisely and accurately in relation to an adjacent magnetic iron body, results in an increase of the magnetic field at least around ten (10) percent and as high as twenty (20) percent or more. The outer magnetic body enhances the uniform distribution of flux at magnetic field intensities substantially above the saturation of iron. Further, a very high precision field is obtained thereby with a uniformity of at least one (1) part per million and as high as one (1) part per one hundred million. Such a high precision field is illustrated in FIGS. 12 and 13.

Figure 14:
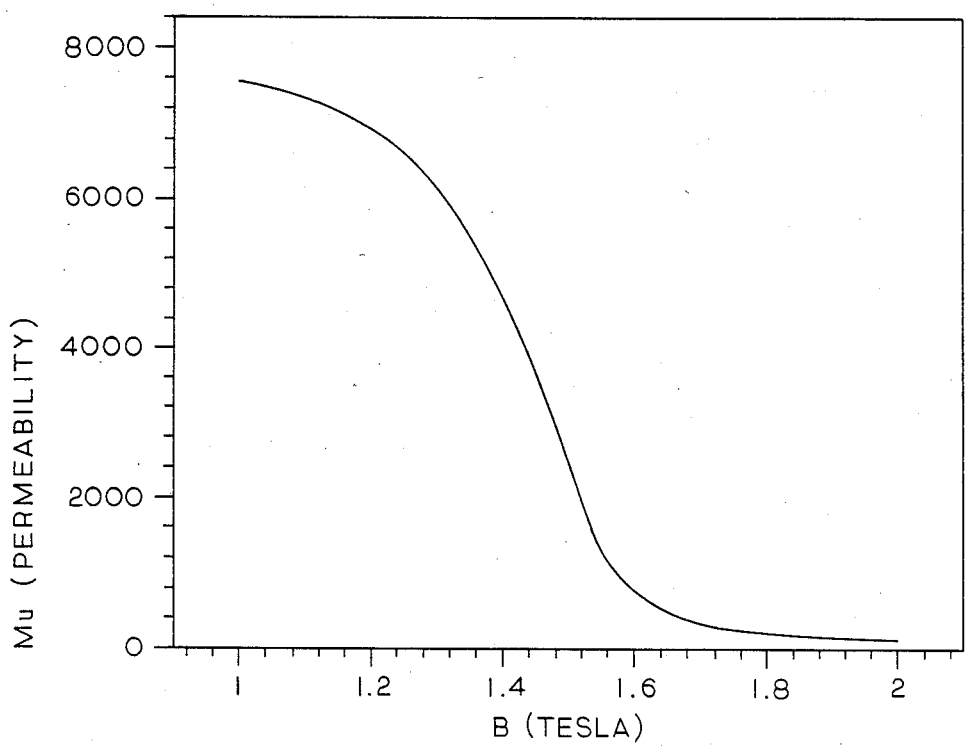
FIG. 14 is a graph showing the permeability of a specific iron material from a magnetic intensity of one (1) Tesla to two (2) Tesla.
Figure 15:
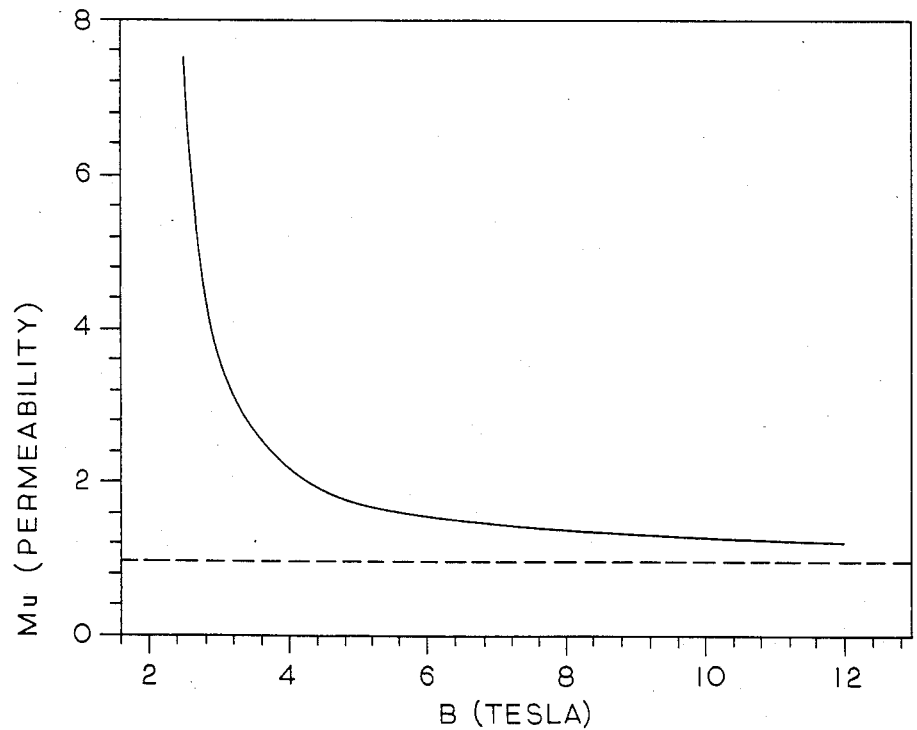
FIG. 15 is a graph showing the permeability of the iron material illustrated in FIG. 14 from a magnetic intensity of two (2) Tesla to twelve (12) Tesla.

Referring to FIGS. 14 and 15, the permeability of a specific iron material, ASTM U.S. 1008 steel, utilized in outer body 16 is illustrated graphically. FIG. 14 shows permeability for a magnetic intensity to two (2) Tesla and FIG. 15 shows the permeability for a magnetic intensity from two (2) Tesla to twelve (12) Tesla. It is noted from FIG. 15 that the permeability of air is one and that the permeability of the iron material illustrated in FIG. 15 from four (4) Tesla to twelve (12) Tesla is between one and two. The permeability was calculated in accordance with the aforementioned publication entitled "The Interpolation of Magnetization Tables".

Figure 16:
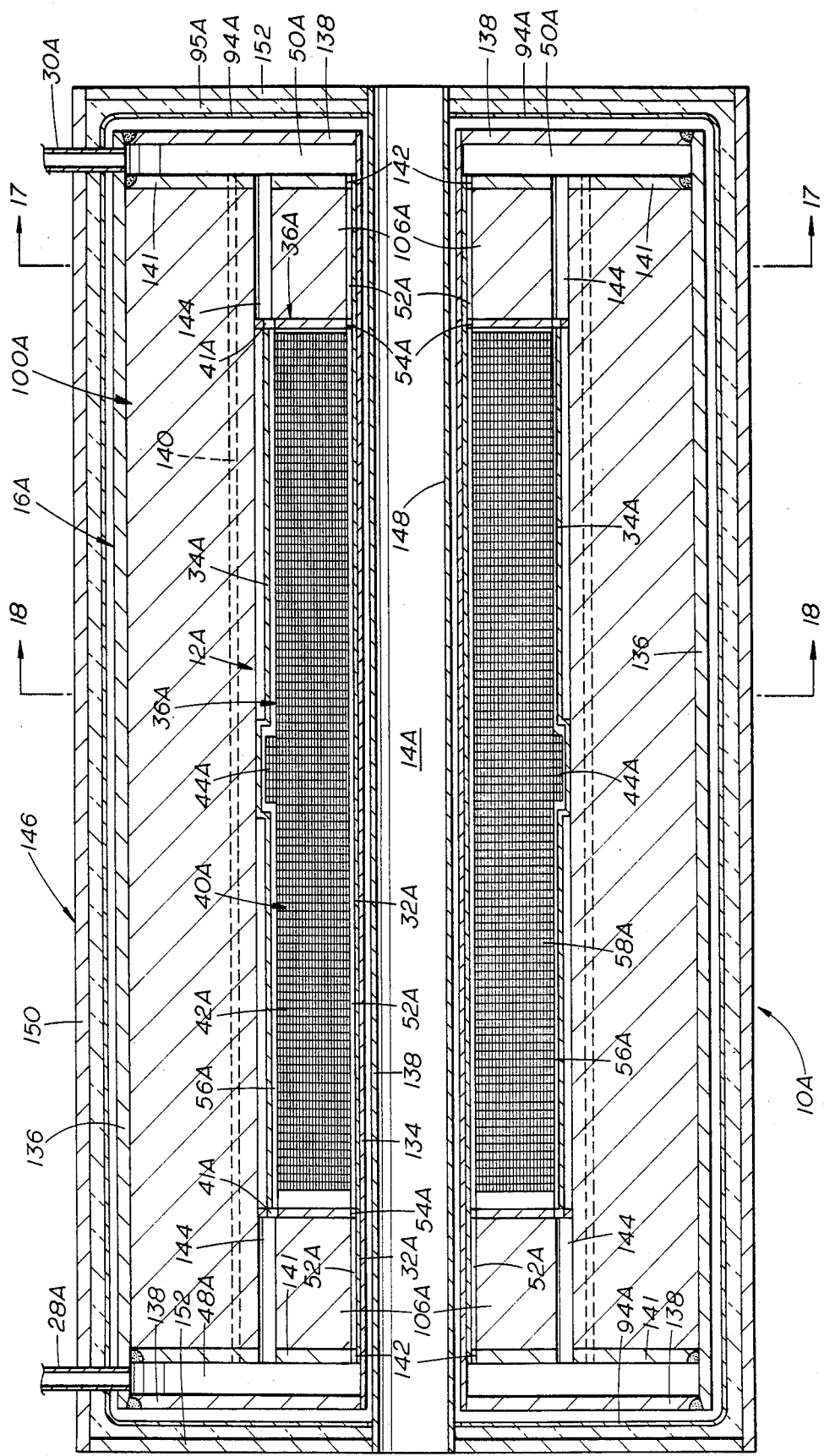
FIG. 16 is a longitudinal sectional view of a modified unitary electromagnetic structure particularly adapted for use in spectroscopy and having a relatively small diameter bore for a high magnetic intensity of around eight (8) Tesla.
Figure 18:
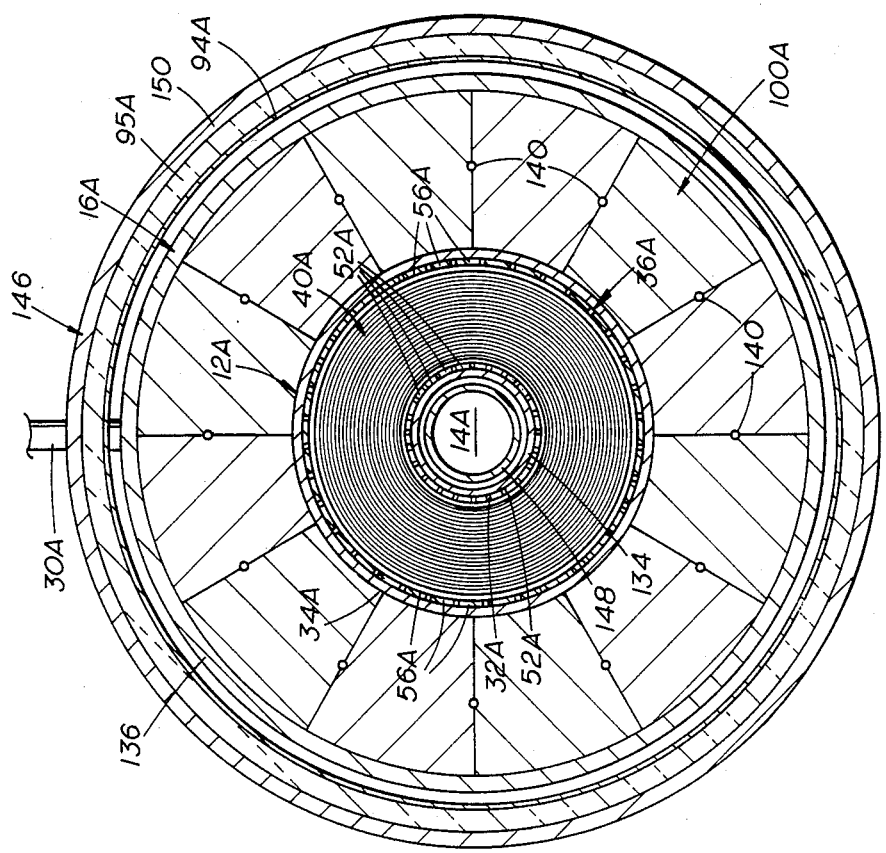
FIG. 18 is a cross section of the modified electromagnetic structure shown in FIG. 16 taken generally along line 18—18 thereof.
Figure 17:
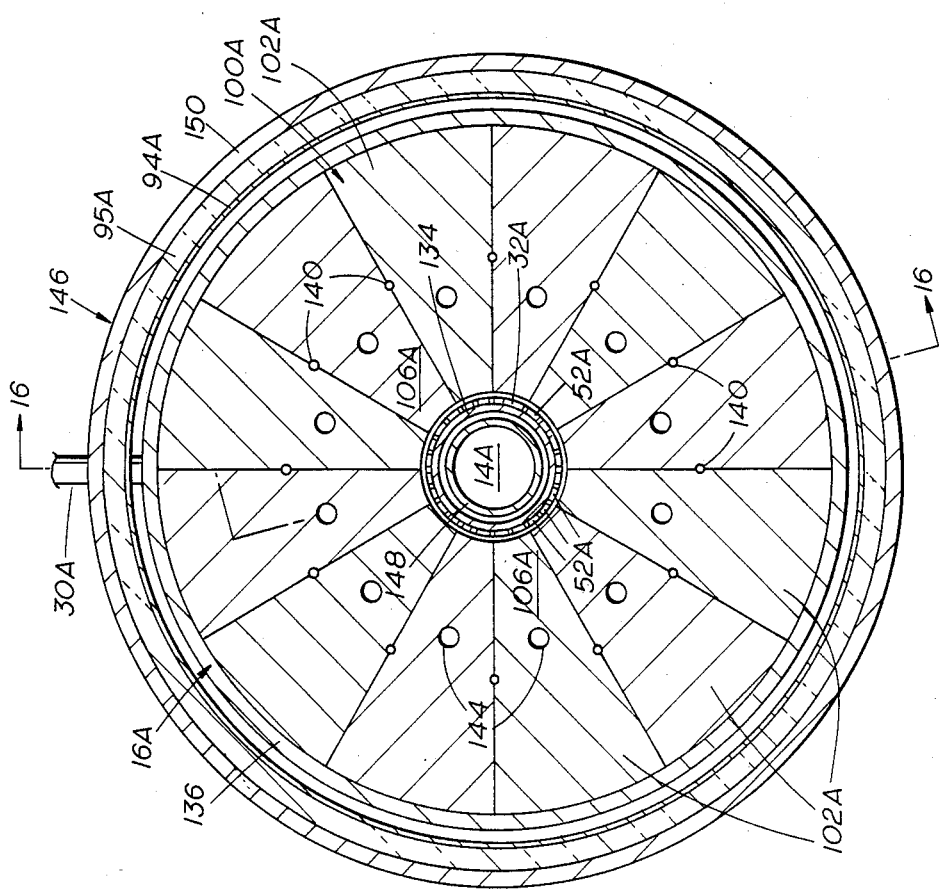
FIG. 17 is a cross section of the modified unitary electromagnetic structure shown in FIG. 16 taken generally along line 17—17 thereof.

Referring now to FIGS. 16-18, a further embodiment of this invention is illustrated which is particularly adapted for use in spectroscopy, and has a small bore of a diameter of around five (5) centimeters in which to place an object such as a blood sample or other material for testing. The electromagnet generally indicated at 10A has an inner body 12A and outer body 16A integrally secured to each other. Thus, the positioning of inner body 12A and outer body 16A in relation to each other must be accurately determined prior to the construction of electromagnet 10A as no provision is made for any adjustment of outer body 16A relative to inner body 12A after construction, as contrasted with electromagnet 10 in the embodiment of FIGS. 1-15 in which the position of inner body 10 relative to outer body 12 may be adjusted both radially and longitudinally after construction of electromagnet 10. Additionally, the iron in the ferromagnetic outer body 16A is exposed to the cooling medium, such as liquid helium. Such an arrangement permits the iron to be positioned closely adjacent the coils which is desirable in order for the iron to have the maximum effect on the coils.

Inner body 12A has an inner shell 32A and a concentric outer shell 34A connected by end plates 41A to form an enclosed housing 36A receiving a coil pack generally indicated at 40A. Coil pack 40A has inner and outer spaced strips 52A and 56A forming fluid flow passages therebetween and includes a main coil 42A extending between end plates 41A. A trim coil 44A of a relatively small width extends circumferentially about main coil 42A and is electrically insulated therefrom for utilizing a current different from main coil 42A. Coils 42A and 44A include spirally wound wire 58A similar to wire 58 of the embodiment of FIGS. 1-15. Openings 54A in end plates 41A permit the flow of the cooling fluid along spaced strips 52A and 56A and coil pack 40A.

An outer enclosed magnetic iron body generally indicated 16A is positioned in concentric relation about inner body 12A. Outer body 16A includes an inner shell 134 and an outer shell 136 with outer end plates 138 connecting the ends of shells 134 and 136. Mounted within body 16A between inner and outer shells 134 and 136 are a plurality of longitudinally extending sections indicated generally at 100A and being generally channel-shaped formed of iron blocks or laminated iron members. Sections 100A include radially extending end segments 102A each preferably formed of laminations having inner end portions 106A laterally adjacent coil pack 40A and housing 36A. Each end segment 102A is insulated from adjacent segments 102A by a suitable insulating coating, such as paint, on contacting sides to minimize any eddy currents. As shown particularly in FIG. 17, each end segment 102A has a semicircular opening 140 in its opposed sides which match a corresponding semicircular opening 140 in an adjacent segment 102A thereby to aid in precisely positioning segments 102A. Openings 140 receive suitable keys for holding segments 102A in position. Sections 100A have similar openings 140. It is pointed out that the twelve (12) longitudinally extending sectios 100A and the twelve (12) end segments 102A are designed to be spaced around four (4) mils from each other at normal room temperature. During the colddown phase, the iron in section 100A and segments 102A contracts less than the other materials forming electromagnet 10A and the space between segments 102A and between sections 100A is closed when the minimum temperatures are reached.

Inner end plates 141 between shells 134 and 136 define a fluid inlet chamber 48A adjacent inlet 28A and a fluid outlet chamber 50A adjacent outlet 30A. Inner shall 32A and inner spaced strips 52A of housing 36A and coil pack 40A extend from housing 36A along inner shell 134 of outer body 16A to inner plates 141. Openings 142 in inner plates 141 permit direct fluid flow between inlet chamber 48A and outlet chamber 50A along the inner circumference of coil pack 40A. Openings 144 extend through end portions 106A of segments 100A and end plates 141 to permit fluid communication with the fluid passages between spaced outer strips 56A. Thus, fluid communication between inlet chamber 48A and outlet chamber 50A is likewise provided along the outer circumference of coil pack 40A. Outer iron body 16A is cooled to a temperature of around four and one-half (4½) degrees Kelvin along with coil pack 40A.

A heat shield 94A is positioned about outer iron body 16A as shown. As outer housing generally indicated 146 encloses both inner body 12A and outer iron body 16A. Outer housing 146 includes inner and outer concentric shells 148 and 150 connected at their end by end plates 152. A central bore 14A is defined by inner shell 148 and provides access to the magnetic field for positioning therein objects to be tested or treated, such as blood samples. A super insulation material 95A is positioned in the space between heat shield 94A and housing 146.

The design of electromagnet 10A is accomplished in a manner similar to the design of electromagnet 10 in the embodiment set forth in FIGS. 1-15. Since no means are provided for adjustment of the positioning of the coils in coil pack 40A relative to outer iron body 16A after the construction of electromagnet 10A, it is necessary to provide a highly accurate positioning of the coils and outer iron body 16A in the initial design.

While the present invention is particularly adapted for use with magnetic fields having an intensity greater than the magnetic saturation of iron, it is to be understood that the present invention may be utilized with magnetic field intensities less than the magnetic saturation of iron. Also, while preferred embodiments of the present invention have been illustrated in detail, it is apparent that modifications and adaptations of the preferred embodiments will occur to those skilled in the art. However, it is to be expressly understood that such modifications and adaptations are within the spirit and scope of the present invention as set forth in the following claims.

What is claimed is:

1. A unitary superconducting electromagnetic structure particularly adapted for use with magnetic field intensities greater than the magnetic saturation of iron and comprising:

an inner generally cylindricl elongate body having dimensions conforming generally to a magnetic field and defining a central bore therethrough for receiving objects to utilize the magnetic field, said inner body having inner and outer concentric shells and containing a plurality of coils arranged in a circular pattern between said inner and outer concentric shells about the magnetic field and positioned generally symmetrically to said inner body, said coils being formed of superconducting wire and adapted for utilization with different predetermined electrical currents; and a. passive magnetic field control means which functions at magnetic field intensities below, at and substantially above the magnetic saturation level of iron utilized in said control means, said control means comprising an outer magnetic iron body extending about said inner body and about that portion of said magnetic field existing at least within the central bore, and aiding in providing a desired shape and intensity of the magnetic field, said magnetic iron body providing a passive containment means which functions substantially to shape said magnetic field produced by said electromagnet so as substantially to confine said magnetic field generated by said electromagnet during operation of said electromagnet to the region enclosed by said outer magnetic iron body, and further providing a closed magnetic path for redirecting the magnetic field for increasing the intensity of the magnetic field at magnetic field intensities substantially above the saturation of the magnetic iron in said outer magnetic iron body.

2. A unitary superconducting electromagnetic structure as set forth in claim 1 wherein said outer magnetic iron body is positioned concentrically about said generally cylindrical inner body and has end portions extending radially inwardly alongside the ends of said inner body and positioned closely adjacent the ends of said inner body and the coils therein.

3. A unitary superconducting electromagnetic structure as set forth in claim 2 wherein said radially extending end portions have a central bore therein having an inner diameter generally similar to the inner diameter of said central bore for said inner body.

4. A unitary superconducting electromagnetic structure as set forth in claim 3 wherein said radially extending end portions have a varying magnetic intensity therein generally between the saturation of iron and the magnetic intensity of the magnetic field.

5. A unitary superconducting electromagnet structure particularly adapted for use with magnetic field intensities greater than the magnetic saturation of iron and comprising:

an inner generally cylindrical elongate body having dimensions conforming generally to a magnetic field and defining a central bore therethrough for receiving objects to utilize the magnetic field, said inner body having inner and outer concentric shells and containing a plurality of coils arranged in a circular pattern between said inner and outer concentric shells about the magnetic field and positioned generally symmetrically to said inner body, said coils being formed of superconducting wire and adapted for utilization with different predetermined electrical currents;

an outer magnetic iron body extending about said inner body and said magnetic field and aiding in providing a desired shape and intensity of the magnetic field, said magnetic iron body providing a closed magnetic path for containing and redirecting the magnetic field for increasing the intensity of the magnetic field at magnetic field intensities substantially above the saturation of the magnetic iron in said outer body; and means for mounting said inner body and said outer magnetic iron body for movement relative to each other so that the relative positioning of said outer magnetic iron body to said coils and said magnetic field may be adjusted within a precise tolerance for providing a magnetic field uniformity of at least around one part per million.

6. A unitary superconducting electromagnetic structure particularly adapted for use with magnetic field intensities greater than the magnetic saturation of iron and comprising:

an inner generally cylindrical elongate body having dimensions conforming generally to a magnetic field and defining a central bore therethrough for receiving objects to utilize the magnetic field, said inner body having inner and outer concentric shells and containing a plurality of coils arranged in a circular pattern between said inner and outer concentric shells about the magnetic field and positioned generally symmetrically to said inner body, said coils being formed of superconducting wire and adapted for utilization with different predetermined electrical currents;

an outer magnetic iron body extending about said inner body and said magnetic field and aiding in providing a desired shape and intensity of the magnetic field, said magnetic iron body providing a closed magnetic path for containing and redirecting the magnetic field for increasing the intensity of the magnetic field at magnetic field intensities substantially above the saturation of the magnetic iron in said outer body, said outer magnetic iron body further positioned concentrically about said generally cylindrical inner body and having end portions extending radially inwardly alongside the ends of said inner body and being positioned closely adjacent the ends of said inner body and the coils therein; and means for mounting said inner body and said outer body for movement relative to each other including adjustable blocks utilizing set screws positioned between said inner body and said outer body.

7. A unitary superconducting electromagnetic structure as set forth in claim 1 wherein said inner body and said outer magnetic iron body are fixed in relation to each other.

8. A unitary superconducting electromagnetic structure having a magnetic field uniformity of at least around one part per million and particularly adapted for use in a magnetic field having a level of intensity greater than 1.5 Tesla, the level at which magnetic iron is saturated, said unitary electromagnet comprising an inner generally cylindrical elongate body having inner and outer generally concentric shells arranged in a concentric relation to each other with said inner shell defining a central bore for receiving objects therein to utilize the magnetic field, and an annular end plate at each end of said elongate body extending between and connecting the opposed ends of said shells to form an enclosed annular space therebetween;

a generally cylindrical coil pack positioned in said enclosed annular space of said inner body between said inner and outer shells and having a plurality of coils, each coil including a core and a wire wound on said core;

means for providing a cooling fluid to said coil pack for cooling said coils; and a passive magnetic field control means which functions at magnetic field intensities below, at and substantially above the magnetic saturation level of iron utilized in the control means, said control means comprising an outer magnetic iron body extending about said inner body and about that portion of said magnetic field existing at least within the central bore, said outer magnetic iron body providing a passive containment means which functions substantially to shape said magnetic field produced by said electromagnet so as to confine said magnetic field generated by said electromagnet during the operation of said electromagnet to the region enclosed by said outer magnetic iron body, and further providing a closed magnetic path for redirecting the magnetic field for increasing the intensity of the magnetic field when said electromagnet is operated at said level of intensity greater than 1.5 Tesla said outer magnetic iron body having radially extending end portions extending alongside the ends of said inner body and positioned closely adjacent the ends of said inner body and the coils therein.

9. A unitary superconducting electromagnetic structure as set forth in claim 8 wherein said radially extending end portions of said outer iron body have a varying magnetic intensity generally between the saturation of iron and the magnetic intensity of the magnetic field.

10. A unitary superconducting electromagnetic structure as set forth in claim 8 wherein a heat shield encircles said coil pack for minimizing heat transfer.

11. A unitary superconducting electromagnetic structure as set forth in claim 8 wherein said core on which the coil is wound comprises a plurality of circumferentially spaced strips along the inner circumference of said coil defining fluid flow passages between the spaced strips through which said cooling fluid flows for cooling the associated coils.

12. A unitary superconducting electromagnetic structure as set forth in claim 11 wherein said plurality of coils are spaced along the longitudinal axis of said coil pack and said inner body has annular end plates with openings therein to provide an inlet fluid flow passage adjacent one end plate and an outlet flow passage adjacent the other opposed end plate, said end plates permitting the flow of cooling fluid therethrough and along the space between said spaced strips between the inlet flow passage and the outlet flow passage.

13. A unitary superconducting electromagnetic structure as set forth in claim 11 wherein a plurality of circumferentially spaced strips are positioned along the outer circumference of said coil and define fluid flow passages therebetween through which said cooling fluid flows for cooling the associated coils.

14. In apparatus for providing a magnetic field having a uniformity of at least around one part per million and particularly adapted for use at magnetic intensities greater than the magnetic saturation of iron;

a unitary superconducting electromagnetic structure generally of a toroidal shape defining an inner elongate cylindrical body having opposed ends and a central bore therethrough, said inner body having inner and outer generally concentric shells arranged in a concentric relation to each other with said inner shell defining a central bore for receiving objects therein to utilize the magnetic field, and an annular end plate at each end of said elongate body extending between and connecting the opposed ends of said shells to form an enclosed annular space therebetween;

a generally cylindrical coil housing positioned in said enclosed annular space of said inner body between and in spaced relation to said inner and outer shells, said coil housing having a generally rectangular longitudinal cross section defining a pair of spaced concentric intermediate shells and an annular end plate at each end of said coil housing to form an enclosed annular space therein;

a coil pack positioned in the enclosed annular space of said coil housing and having a plurality of coils, each coil including a core and wire wound on said core;

means for providing a cooling fluid to said enclosed space of said coil housing for cooling said coils;

an outer magnetic iron body extending about and secured to said inner elongate body between said opposed ends, said outer magnetic iron body including a plurality of longitudinally extending sections spaced circumferentially about said inner elongate body and extending between said opposed ends for providing a closed magnetic path and shaping the magnetic field between the ends of said body in a uniform manner for increasing the intensity of the magnetic field; and an annular end plate structure at each end of said iron body including a plurality of contiguous segments extending radially inwardly from said longitudinally extending sections and alongside the ends of said inner body in closely spaced relation thereto, said radially extending segments having a central bore therein generally similar to the inner diameter of said central bore for said inner body.

15. In apparatus as set forth in claim 14 further including means for electrically insulating said segments of each end plate structure from each other thereby to break up and reduce eddy currents at said end plate structure.

16. In apparatus for providing a magnetic field having a uniformity of at least around one part per million and particularly adapted for use at magnetic intensities greater than the magnetic saturation of iron;

a unitary superconducting electromagnetic structure generally of a toroidal shape defining an inner elongate cylindrical body having opposed ends and a central bore therethrough; said inner body having inner and outer generally concentric shells arranged in a concentric relation to each other with said inner shell defining a central bore for receiving objects therein to utilize the magnetic field, and an annular end plate at each end of said elongate body extending between and connecting the opposed ends of said shells to form an enclosed annular space therebetween;

a generally cylindrical coil housing positioned in said enclosed annular space of said inner body between and in spaced relation to said inner and outer shells, said coil housing having a generally rectangular longitudinal cross section defining a pair of spaced concentric intermediate shells and an annular end plate at each end of said coil housing to form an enclosed annular space therein;

a coil pack positioned in the enclosed annular space of said coil housing and having a plurality of coils, each coil including a core and wire wound on said core;

means for providing a cooling fluid to said enclosed space of said coil housing for cooling said coils;

an outer magnetic iron body extending about and secured to said inner elongate body between said opposed ends, said outer magnetic iron body including a plurality of longitudinally extending sections spaced circumferentially about said inner elongate body and extending between said opposed ends for providing a closed magnetic path and shaping the magnetic field between the ends of said body in a uniform manner for increasing the intensity of the magnetic field;

an annular end plate structure at each end of said iron body including a plurality of contiguous segments extending radially inwardly from said longitudinally extending sections to form a continuous circular path;

means for cooling said electromagnet including cryogenic fluids;

instrumentation means for preselected parameters for measuring the magnetic field generated by said electromagnetic structure; and a microcomputer for receiving the measurements of the preselected parameters and calculating the strength and uniformity of the magnetic field whereby the positioning of said inner body relative to said outer magnetic iron body may be changed in response to said calculations for obtaining maximum uniformity of the magnetic field.

17. A unitary superconducting electromagnetic structure particularly adapted for use in a magnetic field having a level of intensity greater than 1.5 Tesla, the level at which magnetic iron is saturated, said unitary electromagnet comprising an inner elongate body having inner and outer shells defining a central bore for receiving objects therein to utilize the magnetic field, and an end member at each end of said elongate body connecting the opposed ends of said shells to form a space therebetween;

a coil pack positioned in said space of said inner body between said inner and outer shells and having a plurality of coils;

a passive magnetic field control means which functions at magnetic field intensities below, at and substantially above the magnetic saturation level or iron utilized in the control means, said control means comprising an outer magnetic iron body extending about said inner body and about that portion of said magnetic field existing at least within the central bore said outer magnetic iron body providing a passive containment means which functions substantially to shape said magnetic field produced by said electromagnet so as substantially to confine said magnetic field generated by said electromagnet during the operation of said electromagnet to the region enclosed by said outer magnetic iron body, and further providing a closed magnetic path for redirecting the magnetic field for increasing the intensity of the magnetic field when said electromagnet is operated at said level of intensity greater than 1.5 Tesla, said outer magnetic iron body having end portions extending alongside said inner body and positioned closely adjacent the ends of said inner body and the coils therein;

said outer magnetic iron body having a fluid inlet chamber adjacent one end thereof and a fluid outlet chamber adjacent the other end thereof, and fluid flow passages in said outer magnetic iron body between said inlet and outlet chambers; and means to supply cooling fluid to said fluid inlet chamber for flow along said fluid passages to said fluid outlet chamber for cooling of said outer magnetic iron body.

18. A unitary superconducting electromagnetic structure as set forth in claim 17 wherein an outer housing encloses said outer boyd, and a heat shield is positioned between said outer housing and said outer body to minimize heat transfers therebetween.

19. A unitary superconducting electromagnetic structure having a magnetic field uniformity of at least around one part per million and particularly adapted for use in a magnetic field having a level of intensity greater than 1.5 Tesla, the level at which magnetic iron is saturated, said unitary electromagnet comprising an inner generally cylindrical elongate body having inner and outer generally concentric shells arranged in concentric relation to each other with said inner shell defining a central bore for receiving objects therein to utilize the magnetic field, and an annular end plate at each end of said elongate body connecting the opposed ends of said shells to form an enclosed annular space therebetween;

a generally cylindrical coil pack positioned in said enclosed annular space of said inner body between said inner and outer shells and having a plurality of coils;

a passive magnetic field control means which functions at magnetic field intensities below, at and substantially above the magnetic saturation level of iron utilized in the control means, said control means comprising an outer magnetic iron body extending about said inner body and about that portion of said magnetic field existing at least within the central bore, said outer magnetic iron body providing a passive containment means which functions substantially to shape said magnetic field produced by said electromagnet so as substantially to confine said magnetic field generated by said electromagnet during the operation of said electromagnet to the region enclosed by said outer magnetic iron body, and further providing a closed magnetic path for redirecting the magnetic field for increasing the intensity of the magnetic field when said electromagnet is operated at said level of intensity greater than 1.5 Tesla, said outer magnetic iron body having end portions extending alongside said inner body and positioned closely adjacent the ends of said inner body and the coils therein;

said outer magnetic iron body having a fluid inlet chamber adjacent one end portion and a fluid outlet chamber adjacent the other end portion;

fluid passages extending from said inlet chamber to said outlet chamber through said outer magnetic iron body and along said coils; and means supply cooling fluid to said inlet fluid chamber for flow along said fluid passages to said fluid outlet chamber for cooling said coils and outer magnetic iron body.

20. A unitary superconducting electromagnetic structure as set forth in claim 19 wherein each of said end portions comprises a plurality of segments, and means are provided between said segments for electrically insulating the segments from each other to minimize eddy currents.

21. A unitary superconducting electromagnetic structure as set forth in claim 19 wherein an outer housing encloses said inner and outer bodies, said central bore for receiving objects therein extending through said inner and outer bodies and of a diameter conforming to the diameter of the central bore of said outer housing.

22. A unitary superconducting electromagnetic structure as set forth in claim 19 wherein said outer magnetic iron body has longitudinally extending sections connecting said end portions, and said longitudinally extending sections have fluid passages therein extending between said fluid inlet and outlet chambers.

23. A unitary superconducting electromagnetic structure as set forth in claim 8 wherein said outer magnetic iron body provides a passive containment means which functions substantially to shape and substantially to confine said magnetic field, and further provides a closed magnetic path for redirecting the magnetic field for increasing the intensity of the magnetic field when said electromagnet is operated at a level of intensity greater than 2.0 Tesla.

24. A unitary superconducting electromagnetic structure as set forth in claim 17 wherein said outer magnetic iron body provides a passive containment means which functions substantially to shape and substantially to confine said magnetic field, and further provides a closed magnetic path for redirecting the magnetic field for increasing the intensity of the magnetic field when said electromagnet is operated at a level of intensity greater than 2.0 Tesla.

25. A unitary superconducting electromagnetic structure as set forth in claim 19 wherein said outer magnetic iron body provides a passive containment means which functions substantially to shape and substantially to confine said magnetic field, and further provides a closed magnetic path for redirecting the magnetic field for increasing the intensity of the magnetic field when said electromagnet is operated at a level of intensity greater than 2.0 Tesla.

* * * * *